United States Patent

Misumi et al.

[11] Patent Number: 4,536,459
[45] Date of Patent: Aug. 20, 1985

[54] PHOTOCONDUCTIVE MEMBER HAVING MULTIPLE AMORPHOUS LAYERS

[75] Inventors: Teruo Misumi, Kawasaki; Kyosuke Ogawa, Tokyo; Junichiro Kanbe, Yokohama; Keishi Saitoh, Tokyo; Yoichi Osato, Yokohama; Shigeru Shirai, Yamato, all of Japan

[73] Assignee: Canon Kabushiki Kaisha, Tokyo, Japan

[21] Appl. No.: 474,311

[22] Filed: Mar. 11, 1983

[30] Foreign Application Priority Data

Mar. 12, 1982 [JP] Japan .................................. 57-39837
Mar. 12, 1982 [JP] Japan .................................. 57-39838
Mar. 12, 1982 [JP] Japan .................................. 57-39839

[51] Int. Cl.$^3$ ........................ G03G 5/082; G03G 5/14
[52] U.S. Cl. ................................. 430/57; 252/501.1; 357/2; 427/74; 430/84; 430/95
[58] Field of Search ............... 430/57, 84, 95; 427/74; 252/501.1; 357/2

[56] References Cited

U.S. PATENT DOCUMENTS

| | | | |
|---|---|---|---|
| 4,365,107 | 12/1982 | Yamauchi | 427/39 X |
| 4,394,425 | 7/1983 | Shimizu et al. | 430/66 X |
| 4,394,426 | 7/1983 | Shimizu et al. | 430/66 X |
| 4,414,319 | 11/1983 | Shirai et al. | 430/65 |
| 4,452,874 | 6/1984 | Ogawa et al. | 430/57 |
| 4,452,875 | 6/1984 | Ogawa et al. | 430/57 |
| 4,460,669 | 7/1984 | Ogawa et al. | 430/57 |
| 4,460,670 | 7/1984 | Ogawa et al. | 430/84 X |
| 4,465,750 | 8/1984 | Ogawa et al. | 430/57 |

Primary Examiner—John E. Kittle
Assistant Examiner—Mukund J. Shah

[57] ABSTRACT

A photoconductive member, comprises a support for a photoconductive member, a first amorphous layer exhibiting photoconductivity comprising an amorphous material containing silicon atoms as a martix, said first amorphous layer having a first layer region containing oxygen atoms in a distribution which is continuous and ununiform in the direction of layer thickness and a second layer region containing atoms belonging to the group III of the periodic table as constituent atoms in a distribution which is continuous and ununiform in the direction of layer thickness, and a second amorphous layer comprising an amorphous material represented by any of the following formulae:

$$Si_a C_{1-a} \quad (0.4 < a < 1) \tag{1}$$

$$(Si_b C_{1-b})_c H_{1-c} \quad (0.5 < b < 1,\ 0.6 \leq c < 1) \tag{2}$$

$$(Si_d C_{1-d})_e X_{1-e} \quad (0.47 < d < 1,\ 0.8 \leq e < 1) \tag{3}$$

$$(Si_f C_{1-f})_g (H+X)_{1-g} \quad (0.47 < f < 1,\ 0.8 \leq g < 1) \tag{4}$$

(wherein X represents a halogen atom).

21 Claims, 10 Drawing Figures

PHOTOCONDUCTIVE MEMBER HAVING MULTIPLE AMORPHOUS LAYERS

BACKGROUND OF THE INVENTION

1. Field of the Invention

This invention relates to a photoconductive member having sensitivity to electromagnetic waves such as light (herein used in a broad sense, including ultraviolet rays, visible light, infrared rays, X-rays, gamma-rays and the like).

2. Description of the Prior Arts

Photoconductive materials which constitute photoconductive layers for electrophotographic image forming members in the field of image formation, manuscript reading devices, or solid state image pick-up devices are required to have a high sensitivity, a high SN ratio (Photocurrent ($I_p$)/Dark current ($I_d$)), spectral characteristics matching to those of electromagentic waves to be irradiated, a rapid response to light, a desired dark resistance value as well as no harm to human bodies during usage. Further, in a solid state image pick-up device, it is also required that the residual image should easily be treated within a predetermined time. In particular, in case of an image forming member for electrophotography to be assembled in an electrophotographic device to be used in an office as office apparatus, the aforesaid harmless characteristic is very important.

From the standpoint as mentioned above, amorphous silicon (hereinafter referred to as a-Si) has recently attracted attention as a photoconductive material. For example, German Laid-Open Patent Publication Nos. 2746967 and 2855718 disclose applications of a-Si for use in image forming members for electrophotography, and German Laid-Open Patent Publication No. 2933411 an application of a-Si for use in a photoconverting reading device.

However, under the present situation, the photoconductive members having photoconductive layers constituted of a-Si are further required to be improved in a balance of overall characteristics including electrical, optical and photoconductive characteristics such as dark resistance value, photosensitivity and response to light, etc., and hot repetition characteristics, and further stability with lapse of time.

For instance, when applied in an image forming member for electrophotography, residual potential is frequently observed to remain during use thereof if improvements in higher photosensitivity and higher dark resistance are scheduled to be effected at the same time. When such a photoconductive member is repeatedly used for a long time, there will be caused various inconveniences such as accumulation of fatigues by repeated uses or so called ghost phenomenon wherein residual images are formed.

As another disadvantage, for example, according to the experience by the present inventors from a number of experiments, a-Si material constituting the photoconductive layer of an image forming member for electrophotography, while it has a number of advantages, as compared with inorganic photoconductive materials such as Se, CdS, ZnO or organic photoconductive materials such as PVCz or TNF of prior art, is also found to have several problems to be solved. Namely, when charging treatment is applied for formation of electrostatic images on the photoconductive layer of an image forming member for electrophotography having a photoconductive member constituted of a mono-layer of a-Si which has been endowed with characteristics for use in a solar battery of prior art, dark decay is markedly rapid, whereby it is difficult to apply a conventional electrophotographic method.

Further, when the photoconductive member is constituted of a-Si materials, the photoconductive member may contain as respective constituent atoms hydrogen atoms or halogen atoms such as fluorine atoms, chlorine atoms, etc. for improving their electrical, photoconductive characteristics, and boron atoms, phosphorus atoms, etc. for controlling the electroconductivity type as well as other atoms for improving other characteristics. Depending on the manner in which these constituent atoms are contained, there may sometimes be caused problems with respect to electrical, optical or photoconductive characteristics of the layer formed.

That is, for example, not scarcely the life of the photocarriers generated by light irradiation in the photoconductive layer formed is insufficient, or at the dark portion, the charges injected from the support side cannot sufficiently be impeded.

Thus, it is required in designing of a photoconductive material to make efforts to obtain desirable electrical, optical and photoconductive characteristics as mentioned above along with the improvement of a-Si materials per se.

In view of the above points, the present invention contemplates the achievement obtained as a result of extensive studies made comprehensively from the standpoints of applicability and utility of a-Si as an image forming members for electrophotography or a photoconductive member in solid stage image pick-up devices, reading devices, etc. It has now been found that a photoconductive member having a photoconductive layer comprising an amorphous layer exhibiting photoconductivity, which is constituted of a-Si, particularly an amorphous material containing at least one of hydrogen atom (H) and halogen atom (X) in a matrix of silicon atoms, such as so-called hydrogenated amorphous silicon, halogenated amorphous silicon or halogen-containing hydrogenated amorphous silicon (hereinafter referred to comprehensively as a-Si(H,X)), said photoconductive member being prepared by designing so as to have a specific structure, is found to exhibit not only practically extremely excellent characteristics but also surpass the photoconductive members of the prior art in substantially all respects, especially markedly excellent characteristics as a photoconductive member for electrophotography. The present invention is based on such finding.

SUMMARY OF THE INVENTION

The object of the present invention is to provide a photoconductive member having constantly stable electrical, optical and photoconductive characteristics, which is markedly excellent in light fatigue resistance and also excellent in durability without causing any deterioration phenomenon after repeated uses and free entirely or substantially from residual potentials observed.

Another object of the present invention is to provide a photoconductive member having excellent electrophotographic characteristics, which is sufficiently capable of retaining charges at the time of charging treatment for formation of electrostatic charges to the extent such that a conventional electrophotographic method can be very effectively applied when it is provided for use as an image forming member for electrophotography.

Still another object of the present invention is to provide a photoconductive member for electrophotography capable of providing easily a high quality image which is high in density, clear in halftone and high in resolution.

Further, another object of the present invention is to provide a photoconductive member having high photosensitivity, high SN ratio characteristic and good electrical contact with a support.

According to the present invention, there is provided a photoconductive member which comprises a support for a photoconductive member, a first amorphous layer exhibiting photoconductivity comprising an amorphous material containing silicon atoms as a matrix, said first amorphous layer having a first layer region containing oxygen atoms in a distribution which is continuous and ununiform in the direction of layer thickness and a second layer region containing atoms belonging to the group III of the periodic table as constituent atoms in a distribution which is continuous and ununiform in the direction of layer thickness, and a second amorphous layer comprising an amorphous material represented by any of the following formulae:

$$Si_a C_{1-a} (0.4 < a < 1) \tag{1}$$

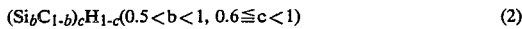

$$(Si_b C_{1-b})_c H_{1-c} (0.5 < b < 1, 0.6 \leq c < 1) \tag{2}$$

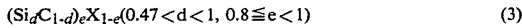

$$(Si_d C_{1-d})_e X_{1-e} (0.47 < d < 1, 0.8 \leq e < 1) \tag{3}$$

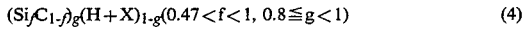

$$(Si_f C_{1-f})_g (H+X)_{1-g} (0.47 < f < 1, 0.8 \leq g < 1) \tag{4}$$

wherein X represents a halogen atom.

DETAILED DESCRIPTION OF THE PREFERRED EMBODIMENTS

Figure 1:
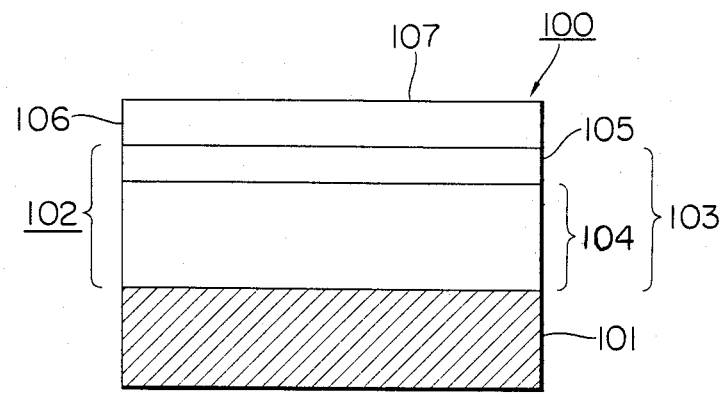
FIG. 1 shows a schematic sectional view for illustration of the layer constitution of a preferred embodiment of the photoconductive member according to the present invention.

Referring now to the drawing, the photoconductive members according to the present invention are to be described in detail below.

FIG. 1 shows a schematic sectional view for illustration of a typical exemplary constitution of the photoconductive member of this invention.

The photoconductive member 100 as shown in FIG. 1 has a support 101 for photoconductive member, a first amorphous layer (I) 102 comprising a-Si, preferably a-Si(H,X) having photoconductivity and a second amorphous layer (II) 106 comprising a-Si(H,X), provided on the support. The first amorphous layer (I) 102 has a layer structure constituted of a first layer region (O) 103 containing oxygen atoms as constituent atoms (in FIG. 1, comprising the whole layer region of the amorphous layer (I) 102), a second layer region 104 (III) containing atoms of an element beloging to the group III of the periodic table (the group III atoms) as constituent atoms and a layer region 105 containing none of the group III atoms on the second layer region (III) 104. The oxygen atoms contained in the first layer region (O) 103 are distributed in said layer region 103 continuously in the direction of the layer thickness in an ununiform distribution, but preferably in a distribution continuous and substantially uniform in the direction substantially parallel to the surface of the support 101.

In the photoconductive member 100 of the present invention as shown in FIG. 1, there is provided a layer region 105 containing no group III atom at the surface portion of the first amorphous layer (I) 102, but said layer region 105 is to be provided, if necessary, and it is not necessarily required to provide such a layer in the present invention. That is, for example, in FIG. 1, the first layer region (O) 103 may be the same layer region as the second layer region (III) 104, or alternatively the second layer region (III) 104 may be provided within the first layer region (O) 103. The group III atoms to be contained in the second layer region (III) 104 are distributed in said layer region (III) 104 continuously in the direction of layer thickness and in an ununiform distribution, but preferably in a distribution continuous and uniform in the direction substantially parallel to the surface of the support 101.

In the photoconductive member according to the present invention, improvements in higher dark resistance and in better adhesion between the first amorphous layer (I) and the support on which it is directly provided are intended preponderantly by incorporation of oxygen atoms in the first layer region (O). In particular, better results may be obtained in case of layer structures, where as shown in the photoconductive member 100 in FIG. 1, the amorphous layer (I) has a first layer region (O) containing oxygen atoms, a second layer region (III) containing the group III atoms and a layer region containing no group III atom, and also having a layer region shared by the first layer region (O) and the second layer region (III).

Also, the distribution of oxygen atoms contained in the first layer region is made in the first place in the direction of its layer thickness so as to be more enriched toward the support side or the bonded interface side with another layer for improvement of adhesion to or contact with the support on which said first layer region (O) is provided or another layer. Secondly, the oxygen atoms contained in the above first layer region (O), in order to make the layer region containing no group III atom (corresponding to the layer region 105 in FIG. 1) highly sensitive to the light irradiation from the free surface side of the second amorphous layer (II), may preferably be contained in the first layer region (O) so that its distribution concentration may be gradually decreased toward the free surface side until the concentration of oxygen atoms may be substantially zero at the interface with the second amorphous layer (II). As for the group III atoms contained in the second layer region (III), in case when the first amorphous layer (I) has a layer region constituting the first amorphous layer (I) and containing no group III atom, in order to make the electrically smooth contact at the bonded interface between the second layer region (III) and the layer region containing no group III atom, the distribution concentration of the group III atoms in the second layer region (III) may preferably be formed so that said distribution concentration on the side of the layer region containing no group III atom is gradually decreased in the direction toward the bonded interface with the layer region containing no group III atom until it is substantially zero on said bonded interface.

In the present invention, the atoms belonging to the group III of the periodic table to be incorporated in the layer region (III) constituting the first amorphous layer (I) may include B (boron), Al (aluminum), Ga (gallium), In (indium), Tl (thallium) and the like. Among them, B and Ga are particularly preferred.

In the present invention, the content of the group III atoms in the second layer region (III), which may be suitably determined as desired so as to achieve effectively the object of the present invention, may be preferably 0.01 to $5 \times 10^4$ atomic ppm, more preferably 0.5 to $1 \times 10^4$ atomic ppm, most preferably 1 to $5 \times 10^3$ atomic ppm. The content of oxygen atoms in the first layer region (O) may also be determined suitably depending on the characteristics required for the photoconductive member formed, but preferably 0.001 to 30 atomic %, more preferably 0.002 to 20 atomic % most preferably 0.003 to 10 atomic %.

FIGS. 2 through 9 show typical examples of the distribution (depth profiles) in the direction of layer thickness of oxygen atoms and the group III atoms contained in the first amorphous layer (I) in the photoconductive layer according to the present invention.

In FIGS. 2 through 9, the axis of abscissa indicates the content C of oxygen atoms or the group III atoms and the axis of ordinate the layer thickness direction of the first amorphous layer (I) exhibiting photoconductivity, $t_B$ showing the position of the surface of the first amorphous layer (I) on the support side and $t_s$ the position of the surface of the first amorphous layer (I) on the side opposite to the support side. That is, the growth of the first amorphous layer (I) containing oxygen atoms and the group III atoms proceeds from the $t_B$ side toward the $t_s$ side.

The scale of the axis of abscissa for oxygen atoms is different from that for the group III atoms. In FIGS. 2 through 9, the solid lines A2–A9 represent depth profiles of oxygen atoms and the solid lines B2–B9 those of the group III atoms, respectively.

Figure 2:
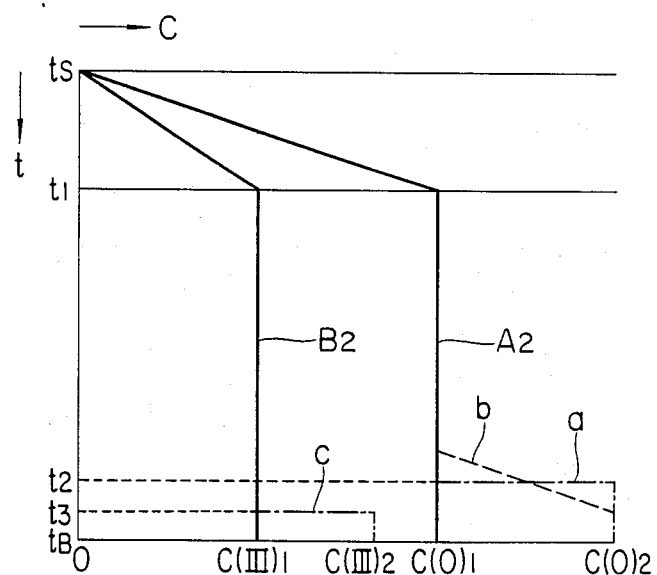
FIGS. 2 through 9 schematic sectional views for illustration of the layer constitutions of the amorphous layer constituting the photoconductive member of the present invention, respectively.

In FIG. 2, there is shown a first typical embodiment of the depth profile of oxygen atoms and the group III atoms in the layer thickness direction contained in the first amorphous layer (I).

According to the embodiment as shown in FIG. 2, the first amorphous layer (I) (the whole layer region from $t_s$ to $t_B$) exhibiting photoconductivity, has a layer region ($t_1$ $t_B$) (the layer region between $t_1$ and $t_B$) wherein oxygen atoms are distributed at a distribution concentration of $C_{(O)1}$ and the group III atoms at a distribution concentration of $C_{(III)1}$ substantially uniformly in the layer thickness direction from the support side and a layer region ($t_s$ $t_1$) wherein oxygen atoms are gradually decreased linearly in distribution concentration from $C_{(O)1}$ to substantially zero and the group III atoms decreased linearly in distribution from $C_{(III)1}$ to substantially zero.

In case of the embodiment as shown in FIG. 2, where the first amorphous layer (I) (layer region ($t_s$ $t_B$)) is provided on the support side, has a contact interface with the support or another layer (corresponding to $t_B$) and a layer region ($t_1$ $t_s$) with oxygen atoms and the group III atoms being uniformly distributed, the distribution concentrations $C_{(III)1}$ and $C_{(O)1}$, which may suitably be determiend as desired in relation to the support or other layers, are 30 to $5 \times 10^4$ atomic ppm, more preferably 50 to $1 \times 10^4$ atomic ppm, most preferably 100 to $5 \times 10^3$ atomic ppm, based on silicon atoms, for $C_{(III)1}$, and preferably 0.01 to 50 atomic %, more preferably 0.02 to 40 atomic %, most preferably 0.03 to 30 atomic %, for $C_{(O)1}$.

The layer region ($t_s$ $t_1$) is provided primarily for the purpose of improvement in higher photosensitivity, and the layer thickness of said layer region ($t_s$ $t_1$) should be determined suitably as desired in relation to the distribution concentration $C_{(O)1}$ of oxygen atoms and the distribution concentration $C_{(III)1}$ of the group III atoms, especially the distribution concentration $C_{(O)1}$.

In the present invention, the layer region ($t_s$ $t_1$) constituting the first amorphous layer (I) may have a thickness preferably of 100 Å or more, more preferably 200 Å or more, most preferably 500 Å or more.

In a photoconductive member having depth profiles of oxygen atoms and the group III atoms as shown in FIG. 2, for improvement of adhesion with the support or between other layers as well as inhibition of charges from the support side to the first amorphous layer (I), while also aiming at improvements in higher photosensitivity and higher dark resistance, it is preferable to provide a layer region ($t_2$ $t_B$) which is made higher in distribution concentration of oxygen atoms than the distribution concentration $C_{(O)1}$ at the portion on the support side surface (corresponding to the position $t_B$) in the first amorphous layer (I) as shown by the dot and dash line a in FIG. 2.

The distribution concentration $C_{(O)2}$ of oxygen atoms in the layer region ($t_2$ $t_B$) where oxygen atoms are distributed at a high concentration may be generally 70 atomic % or less, preferably 50 atomic % or less, most preferably 30 atomic % or less, based on silicon atoms. The depth profile of oxygen atoms in the layer region, where oxygen atoms are distributed at higher concentration may be made constant (uniform) in the layer thickness direction as shown by the dot and dash line a in FIG. 2, or alternatively in order to make good electrical contact with adjacent layer region to which it is directly bonded, it may be made a constant value of $C_{(O)2}$ from the support side to a certain thickness and decreased continuously thereafter gradually to $C_{(O)1}$ as shown by the broken line b in FIG. 2.

The depth profile of the group III atoms contained in the second layer region (III) may be preferably made so as to give a layer region maintaining a constant value of distribution concentration $C_{(III)1}$ (corresponding to the layer region ($t_1$ $t_B$)) on the support side, but it is more preferable for the purpose of inhibiting efficiently injection of charges from the support side to the first amorphous layer (I) to provide a layer region ($t_3$ $t_B$) in which the group III atoms are distributed at a high concentration as shown by the dot and dash line c in FIG. 2.

In the present invention, the layer region ($t_3$ $t_B$) may be preferably provided within 5μ from the position $t_B$. The layer region ($t_s$ $t_B$) may be made the whole layer region ($L_T$) to the thickness of 5μ from the position $t_B$, or may be provided as a part of the layer region ($L_T$).

It may be suitably determined depending on the characteristics required for the first amorphous layer (I) formed, whether the layer region ($t_3$ $t_B$) should be made a part or whole of the layer region ($L_T$).

The layer region ($t_3$ $t_B$) may be desirably formed so that the group III atoms may be distributed in the layer thickness direction with the maximum distribution value (distribution concentration value) $C_{max}$ being generally 50 atomic ppm or more, preferably 80 atomic ppm or more, most preferably 100 atomic ppm or more.

That is, in the present invention, the second layer region (III) containing the group III atoms may preferably be formed so that the maximum value $C_{max}$ of the content depth profile may exist at a depth within $5\mu$ of layer thickness from the support side (layer region of $5\mu$ thickness from $t_B$).

In the present invention, the layer region ($t_2\, t_B$) where oxygen atoms are distributed in higher concentration and the layer region ($t_3\, t_B$) where the group III atoms are distributed in higher concentration may have thickness, which may suitably be determined depending on the contents and the distribution states of oxygen atoms or the group III atoms, may be desired to be preferably 10 Å to $10\mu$, more preferably 20 Å to $8\mu$, most preferably 30 Å to $5\mu$.

Figure 3:
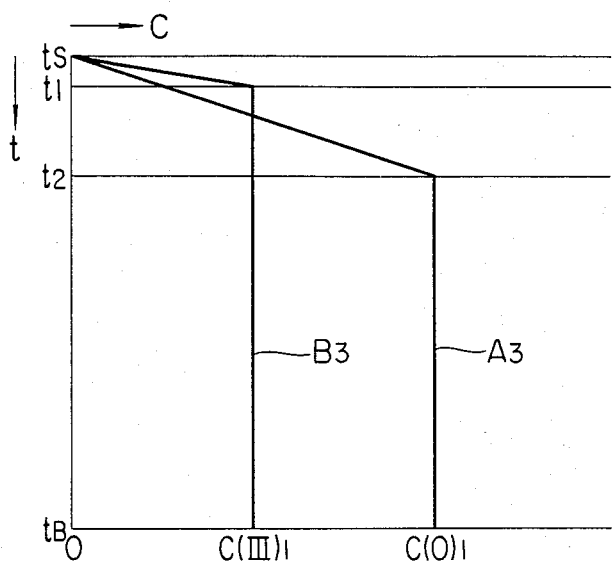

The embodiment shown in FIG. 3 is basically similar to that shown in FIG. 2, but differs in the following point. That is, in the embodiment shown in FIG. 2, both of the distribution concentrations of oxygen atoms and of the group III atoms commence to be decreased at the position $t_1$ until they become substantially zero at the position $t_s$. In contrast, in case of the embodiment in FIG. 3, the distribution concentration of oxygen atoms begins to be decreased at the position $t_2$, as shown by the solid line $A_3$, while the distribution concentration of the group III atoms at the position $t_1$, as shown by the solid line $B_3$, respectively, both becoming substantially zero at the position $t_s$.

That is, the layer region ($t_s\, t_B$) corresponding to the first layer region (O) containing oxygen atoms referred to in the present invention is constituted of a layer region ($t_2\, t_B$) in which they are contained substantially uniformly at a distribution concentration of $C_{(O)1}$ and a layer region ($t_s\, t_2$) in which the distribution concentration is decreased linearly from $C_{(O)1}$ to substantially zero.

The layer region ($t_s\, t_B$) corresponding to the second layer region (III) containing the group III atoms referred to in the present invention is constituted of a layer region ($t_1\, t_B$) in which they are contained substantially uniformly at a distribution concentration of $C_{(III)1}$ and a layer region ($t_s\, t_1$) in which the distribution concentration is decreased linearly from $C_{(III)1}$ to substantially zero.

Figure 4:
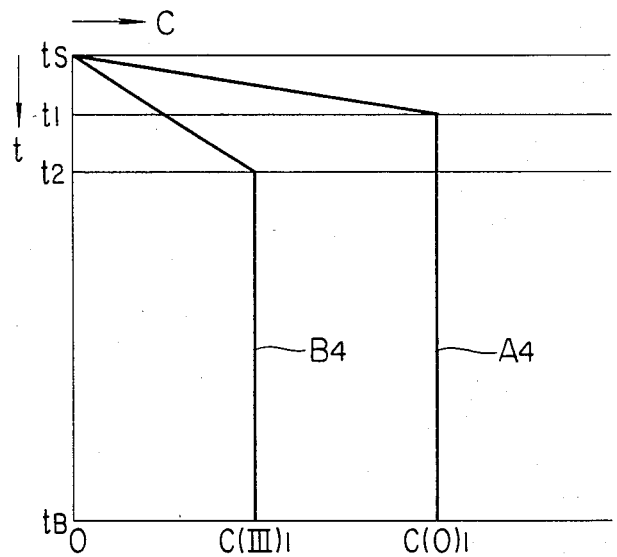

The embodiment shown in FIG. 4 is a modification of the embodiment shown in FIG. 3, having the same constitution as in FIG. 3 except that there is provided a layer region ($t_2\, t_B$) where the group III atoms are contained in a uniform distribution at a distribution concentration of $C_{(III)1}$ within a layer region ($t_1\, t_B$) where oxygen atoms are distributed uniformly at a distribution concentration of $C_{(O)1}$.

Figure 5:
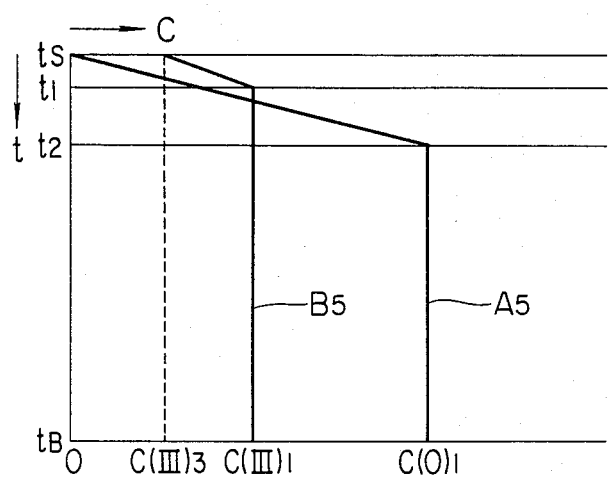

The embodiment shown in FIG. 5 is a case having a layer region in which the group III atoms are contained in a distribution concentration $C_{(III)3}$.

In case of the embodiment shown in FIG. 5, the layer region ($t_s\, t_B$) corresponding to the first amorphous layer (I) is constituted, from the side of the support, a layer region ($t_2\, t_B$) containing both oxygen and the group III atoms distributed uniformly in the layer thickness direction, a layer region ($t_1\, t_2$) containing the group III atoms distributed uniformly but the oxygen atoms distributed unuformly on said layer region ($t_2\, t_B$) and a layer region ($t_s\, t_1$) containing both of the group III atoms and oxygen atoms distributed ununiformly.

That is, the layer region ($t_s\, t_B$) containing oxygen atoms is constituted of a layer region ($t_2\, t_B$) in which oxygen atoms are distributed substantially uniformly at a concentration of $C_{(O)1}$ and a layer region ($t_s\, t_2$) in which the concentration is gradually decreased linearly from $C_{(O)1}$ to substantially zero.

Also, the layer region ($t_s\, t_B$) has a layer constitution in which there are laminated a layer region ($t_1\, t_B$) in which the group III atoms are distributed substantially uniformly in a concentration of $C_{(III)1}$ and a layer region ($t_s\, t_1$) in which the concentration is decreased continuously and linearly from the concentration $C_{(III)1}$ to a concentration $C_{(III)3}$.

Figure 6:
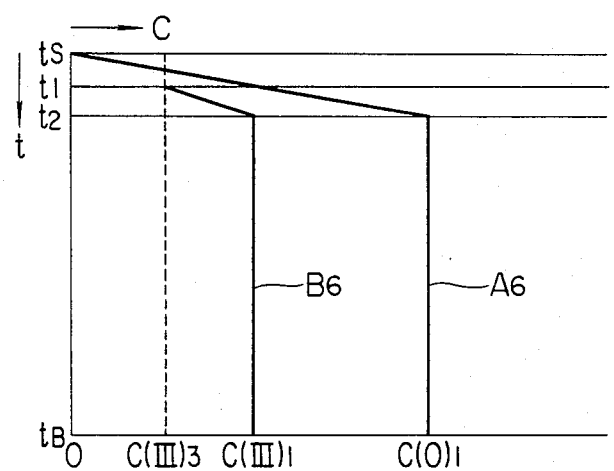

FIG. 6 shows a modification of the embodiment as shown in FIG. 5.

In case of the embodiment shown in FIG. 6, there are provided a layer region ($t_2\, t_B$) in which oxygen atoms and the group III atoms are distributed at uniform distribution concentrations of $C_{(O)1}$, $C_{(III)1}$, respectively, a layer region ($t_s\, t_2$) in which oxygen atoms are contained in a depth profile linearly decreased from the concentration $C_{(O)1}$ to substantially zero, a layer region ($t_1\, t_2$) in which the group III atoms are contained in depth profile linearly decreased within said layer region ($t_s\, t_2$), and a layer region ($t_s\, t_1$) in which substantially no group III atom is contained.

On the layer region ($t_2\, t_B$), there is provided a layer region ($t_s\, t_2$) containing substantially no oxygen atom, which layer region ($t_s\, t_2$) being constituted of a layer region ($t_1\, t_2$) containing uniformly the group III atoms and a layer region ($t_s\, t_1$) in which the group III atoms are contained in a depth profile gradually decreased from the concentration $C_{(III)3}$.

Figure 7:
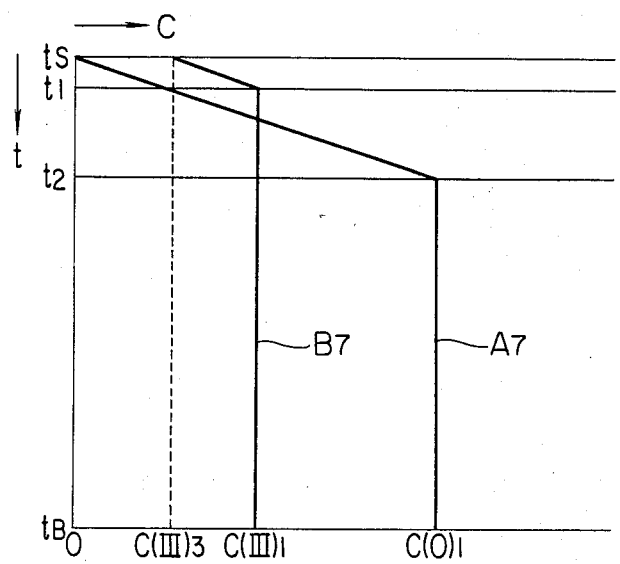

FIG. 7 shows an embodiment wherein the group III atoms are contained in the whole region of the layer region ($t_s\, t_B$) corresponding to the first amorphous layer (I), and the group III atoms are contained at the concentration $C_{(III)3}$ also at the surface position $t_s$.

The layer region ($t_s\, t_B$) containing oxygen atoms, as shown by the solid line A 7, has a layer region ($t_2\, t_B$) in which they are contained substantially uniformly at a distribution concentration of $C_{(O)1}$ and a layer region (O) ($t_1\, t_3$) in which oxygen atoms are contained in a depth profile gradually decreasing from the distribution concentration $C_{(O)1}$ to substantially zero.

The distribution of the group III atoms in the layer region ($t_s\, t_B$) corresponding to the first amorphous layer (I) is shown by the solid line $B_7$. That is, the layer region ($t_s\, t_B$) containing the group III atoms has a layer region ($t_1\, t_B$) in which they are contained substantially uniformly at a distribution concentration of $C_{(III)1}$ and, in order to make the distribution of the group III atoms between the distribution concentration $C_{(III)1}$ and the distribution concentration $C_{(III)3}$ continuously changed, a layer region ($t_s\, t_1$) in which the group III atoms are contained in a depth profile which is continuously changed linearly between these distribution concentrations.

Figure 8:
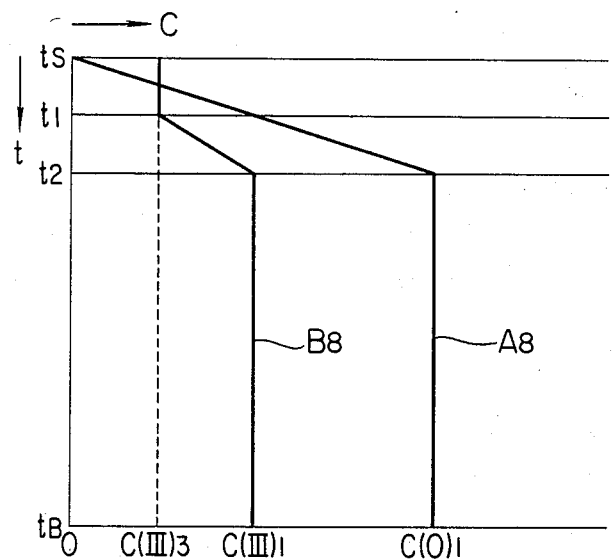

FIG. 8 shows a modification of the embodiment shown in FIG. 7.

Throughout the whole layer region of the first amorphous layer (I) (corresponding the layer region ($t_s\, t_B$)), oxygen atoms and the group III atoms are contained, as shown by the solid line $A_8$ and $B_8$, respectively. In the layer region ($t_2\, t_B$), oxygen atoms are contained uniformly at a distribution concentration of $C_{(O)1}$ and the group III atoms uniformly at a distribution concentration of $C_{(III)1}$, respectively, while in the layer region ($t_s$ $t_1$) the group III atoms are contained uniformly at a distribution concentration of $C_{(III)3}$.

Oxygen atoms are contained, as shown by the solid line A8, in the layer region ($t_s$ $t_2$) in a depth profile gradually decreased linearly from the distribution concentration $C_{(O)1}$ at the support side to substantially zero at the position $t_s$.

In the layer region ($t_1$ $t_2$), the group III atoms are contained in a depth profile gradually decreased from the distribution concentration of $C_{(III)1}$ to the distribution concentration $C_{(III)3}$.

Figure 9:
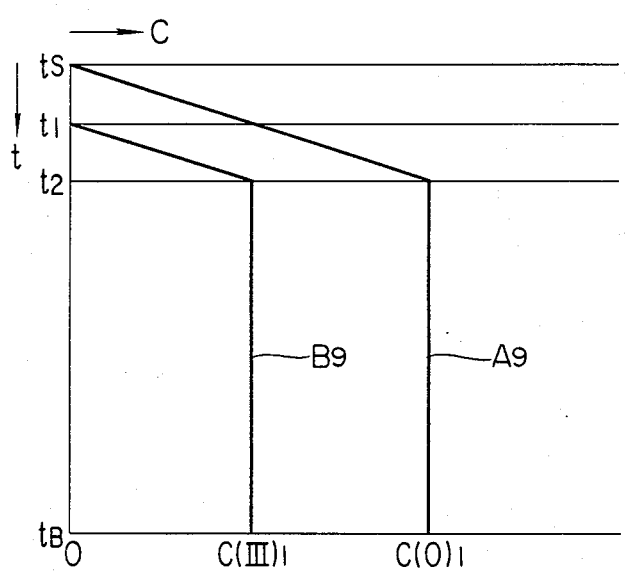

In the embodiment as shown in FIG. 9, both of oxygen atoms and the group III atoms are contained in ununiform depth profiles in a layer region continuously distributed and there is provided a layer region ($t_1$ $t_B$) containing the group III atoms within a layer region ($t_s$ $t_B$) containing oxygen atoms.

And, in the layer region ($t_2$ $t_B$), oxygen atoms are contained substantially uniformly at the distribution concentration $C_{(O)1}$ and the group III atoms substantially uniformly at the distribution concentration $C_{(III)1}$, and in the layer region ($t_1$ $t_2$), oxygen atoms and the group III atoms are contained so that the respective distribution concentrations may be decreased as the growth of respective layers, and in case of the group III atoms, the distribution concentration being made substantially zero at the position $t_1$. In the embodiment as shown in FIG. 9, the first layer region (O) containing oxygen atoms and the second layer region (III) containing the group III atoms are substantially the same layer region, said embodiment having also a surface layer region containing none of oxygen atoms and the group III atoms.

Oxygen atoms are contained in the layer region ($t_s$ $t_1$) in which no group III atoms are contained so as to form depth profile linearly decreased until the distribution concentration is substantially zero at $t_s$.

Having described about some typical examples of the distributions of oxygen atoms and the group III atoms in the layer thickness direction contained in the amorphous layer by referring to FIGS. 2 through 9, it is also possible in case of FIGS. 3 through 9 to provide a layer region with a depth profile having a portion with higher distribution concentration C of oxygen atoms or the group III atoms on the support side and a portion significantly lowered in the distribution concentration C as compared with the support side on the surface $t_s$ side, similarly as described with reference to FIG. 2.

In the present invention, as the halogen atom (X) which may optionally be incorporated in the first amorphous layer (I), there may be included typically fluorine, chlorine, bromine and iodine, especially preferably fluorine and chlorine.

In the present invention, formation of an amorphous layer constituted of a-Si(H,X) may be conducted according to the vacuum deposition method utilizing discharging phenomenon, such as glow discharge method, sputtering method or ion-plating method. For example, for formation of the first amorphous layer (I) constituted of a-Si(H,X) according to the glow discharge method, the basic procedure comprises introducing a starting gas for introduction of hydrogen atoms or/and halogen atoms together with a starting gas for supplying silicon atoms (Si) into the deposition chamber which can be internally brought to a reduced pressure, and exciting glow discharge in said deposition chamber, thereby forming a layer consisting of a-Si(H,X) on the surface of a support set in a predetermined position. For formation of the layer according to the sputtering method, when effecting sputtering of a target constituted of Si in an atmosphere of, for example, an inert gas such as Ar, He, etc. or a gas mixture based on these gases, a gas for introduction of hydrogen atoms (H) or halogen atoms (X) may be introduced into the deposition chamber for sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

Effective starting gases for introduction of halogen atoms to be used in the present invention may include a large number of halogen compounds, as exemplified by halogen gases, halides, interhalogen compounds, or gaseous or gasifiable halogen compounds such as silane derivatives substituted with halogens.

Further, there may also be included gaseous or gasifiable silicon compounds containing halogen atoms constituted of silicon atoms and halogen atoms as constituent elements as effective ones in the present invention.

Typical examples preferably used in the present invention may include halogen gases such as of fluorine, chlorine, bromine or iodine, interhalogen compounds such as BrF, ClF, $ClF_3$, $BrF_5$, $BrF_3$, $IF_3$, ICl, IBr, etc. As the silicon compounds containing halogen atoms (X), namely so called silane derivatives substituted with halogens, there may preferably be employed silicon halides such as $SiF_4$, $Si_2F_6$, $SiCl_4$, $SiBr_4$ and the like.

When the characteristic photoconductive member of the present invention is to be formed according to the glow discharge method by employment of such a silicon compound containing halogen atoms, it is possible to form a first amorphous layer constituted of a-Si:X on a certain support without use of a hydrogenated silicon gas as the starting material capable of supplying Si.

For formation of a first amorphous layer (I) containing halogen atoms according to the glow discharge method, the basic procedure comprises introducing a silicon halide gas as starting gas for supplying silicon atoms and a gas such as Ar, $H_2$, He, etc. at a predetermined mixing ratio and gas flow rates into a deposition chamber for formation of the amorphous layer (I) and exciting glow discharging therein to form a plasma atmosphere of these gases, whereby the first amorphous layer (I) can be formed on a certain support. For the purpose of introduction of hydrogen atoms, these gases may further be admixed at a desired level with a gas of a silicon compound containing hydrogen atoms.

Also, the respective gases may be used not only as single species but as a mixture of plural species.

For formation of a first amorphous layer (I) comprising a-Si(H,X) according to the reactive sputtering method or the ion plating method, for example, in case of the sputtering method, sputtering may be effected by use of a target of Si in a certain gas plasma atmosphere; or in case of the ion plating method, a polycrystalline silicon or a single crystalline silicon is placed as a vapor source in a vapor deposition boat and the silicon vapor source is vaporized by heating according to the resistance heating method or the electron beam method (EB method), and the resultant flying vaporized product is permitted to pass through the gas plasma atmosphere.

During this procedure, in either of the sputtering method or the ion plating method, introduction of halogen atoms into the layer formed may be effected by introducing a gas of a halogen compound or a silicon compound containing halogen atoms as described above into the deposition chamber and forming a plasma atmosphere of said gas.

Also, for introduction of hydrogen atoms, a starting gas for introduction of hydrogen atoms, such as $H_2$, or a gas of silanes such as those mentioned above may be introduced into the deposition chamber and a plasma atmosphere of said gas may be formed therein.

In the present invention, as the starting gas for introduction of halogen atoms, the halogen compounds or silicon compounds containing halogens as mentioned above can effectively be used. In addition, it is also possible to use a gaseous or gasifiable halide containing hydrogen atom as one of the constituent such as hydrogen halide, including HF, HCl, HBr, HI and the like or halo-substituted hydrogenated silicon, including $SiH_2F_2$, $SiH_2I_2$, $SiH_2Cl_2$, $SiHCl_3$, $SiH_2Br_2$, $SiHBr_3$ and the like as an effective starting material for formation of a first amorphous layer (I).

These halides containing hydrogen atom, which can introduce hydrogen atoms very effective for controlling electrical or photoelectric characteristics into the layer during formation of the first amorphous layer (I) simultaneously with introduction of halogen atoms, can preferably be used as the starting material for introduction of halogen atoms.

For incorporation of hydrogen atoms structurally into the first amorphous layer (I), other than the above method, $H_2$ or a gas of hydrogenated silicon, including $SiH_4$, $Si_2H_6$, $Si_3H_8$ and $Si_4H_{10}$ and so on may be permitted to be co-present with a silicon compound for supplying Si in a deposition chamber, wherein discharging is excited.

For example, in case of the reactive sputtering method, a Si target is used and a gas for introduction of halogen atoms and $H_2$ gas are introduced together with, if necessary, an inert gas such as He, Ar, etc. into a deposition chamber, wherein a plasma atmosphere is formed to effect sputtering of said Si target, thereby forming the first amorphous layer (I) of a-Si(H,X) on the substrate.

Further, there may also be introduced a gas such as of $B_2H_6$ or others in order to effect also doping of impurities.

The amount of hydrogen atoms (H) or halogen atoms (X) incorporated in the first amorphous layer (I) in the photoconductive member formed in the present invention, or total amount of both of these atoms, may be preferably 1 to 40 atomic %, more preferably 5 to 30 atomic %.

For controlling the amounts of hydrogen atoms (H) or/and halogen atoms (X) in the first amorphous layer (I), the support temperature or/and the amounts of the starting materials for incorporation of hydrogen atoms (H) or halogen atoms (X) to be introduced into the deposition device system or the discharging power may be controlled.

In the present invention, as a diluting gas to be used in formation of the first amorphous layer (I) by the glow discharge method or the sputtering method, there may be preferably employed a so-called rare gas such as He, Ne, Ar and the like.

For formation of the first layer region (O) and the second layer (III) by introducing oxygen and the group III atoms into the first amorphous layer (I), a starting material for introduction of the group III atoms and a starting material for introduction of oxygen atoms may be used, respectively, together with the starting material for formation of the amorphous layer as mentioned above during formation of the layer by the glow discharge method or the reactive sputtering method, and may be incorporated in the layer while controlling their amounts.

When the glow discharge method is to be employed for formation of the first layer region (O) constituting the first amorphous layer (I), the starting material as the starting gas for formation of the layer region (O) may be constituted by adding a starting material for introduction of oxygen atoms to the starting material selected as desired from those for formation of the first amorphous layer (I) as mentioned above. As such a starting material for introduction of oxygen atoms, there may be employed most of gaseous or gasifiable substances containing oxygen atoms.

For example, there may be employed a mixture of a starting gas containing silicon atoms (Si) as constituent atoms, a starting gas containing oxygen atoms (O) as constituent atoms and optionally a starting gas containing hydrogen atoms (H) or/and halogen atoms (X) as constituent atoms at a desired mixing ratio; a mixture of a starting gas containing silicon atoms (Si) as constituent atoms and a starting gas containing oxygen atoms (O) and hydrogen atoms (H) as constituent atoms also at a desired mixing ratio; or a mixture of a starting gas containing silicon atoms (Si) as constituent atoms and a starting gas containing the three atoms of silicon atoms (Si), oxygen atoms (O) and hydrogen atoms (H) as constituent atoms.

Alternatively, there may also be employed a mixture of a starting gas containing silicon atoms (Si) and hydrogen atoms (H) as constituent atoms and a starting gas containing oxygen atoms (O) as constituent atoms.

More specifically, there may be mentioned, for example, oxygen ($O_2$), ozone ($O_3$), nitrogen monooxide (NO), nitrogen dioxide ($NO_2$), dinitrogen monooxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$), and lower siloxanes containing silicon atoms (Si), oxygen atoms (O) and hydrogen atoms (H) as constituent atoms such as disiloxane $H_3SiOSiH_3$, trisiloxane $H_3SiOSiH_2OSiH_3$, and the like.

For formation of the first layer region (O) containing oxygen atoms according to the sputtering method, a single crystalline or polycrystalline Si wafer or $SiO_2$ wafer or a wafer containing Si and $SiO_2$ mixed therein may be employed and sputtering of these wafers may be conducted in various gas atmospheres.

For example, when Si wafer is employed as the target, a starting gas for introduction of oxygen atoms optionally together with a starting gas for introduction of hydrogen atoms or/and halogen atoms, which may optionally be diluted with a diluting gas, may be introduced into a deposition chamber for sputtering to form gas plasma of these gases, in which sputtering of the aforesaid Si wafer may be effected.

Alternatively, by use of separate targets of Si and $SiO_2$ or one sheet of a target containing Si and $SiO_2$ mixed therein, sputtering may be effected in an atmosphere of a diluting gas as a gas for sputtering or in a gas atmosphere containing at least hydrogen atoms (H) or/and halogen atoms (X) as constituent atoms. As the starting gas for introduction of oxygen atoms, there may be employed the starting gases shown as examples in the glow discharge method previously described also as effective gases in case of sputtering.

For formation of the second layer region (III) constituting the first amorphous layer (I), a gaseous or gasifiable starting material for introduction of the group III atoms may be introduced under gaseous state together with the starting gases for formation of the amorphous layer (I) as mentioned above during formation of the first amorphous layer (I) as described above into a vacuum deposition chamber for formation of the first amorphous layer (I).

The content of the group III atoms to be introduced into the second layer region (III) may be controlled freely by controlling the gas flow rate, the gas flow rate ratio of the starting materials for introduction of the group III atoms to be flown into the deposition chamber, the discharging power and others.

As the starting material for introduction of the group III atoms, which can effectively used in the present invention, there may be included hydrogenated boron such as $B_2H_6$, $B_4H_{10}$, $B_5H_9$, $B_5H_{11}$, $B_6H_{10}$, $B_6H_{12}$, $B_6H_{14}$, etc. boron halides such as $BF_3$, $BCl_3$, $BBr_3$, etc. for introduction of boron atoms. In addition, there may also effectively be used $AlCl_3$, $GaCl_3$, $Ga(CH_3)_3$, $InCl_3$, $TlCl_3$, etc.

In the present invention, formation of the transition layer region (the layer region where either of the distribution concentrations of oxygen atoms or the group III atoms is varied in the layer thickness direction) can be achieved by varying suitably the flow rate of the gas containing the component of which distribution concentration should be varied. For example, by the manual method or any other method conventionally used such as an externally driven motor, etc., the opening of certain needle valve provided in the course of the gas flow channel system may be gradually varied. During this procedure, the rate of variation is not necessarily require to be linear, but the flow rate may be controlled according to a variation rate curve previously designed by means of, for example, a microcomputer to give a desired content curve.

At the boundary between the transition layer region and other layer regions during preparation of the amorphous layer (I), the plasma state may be either maintained or intermitted to have no influence on the characteristics of the layer, but it is preferred to operate continuously, also from the standpoint of the process control.

In the present invention, the first amorphous layer (I) may have a layer thickness, which may suitably be determined depending on the characteristics required for the photoconductive member to be prepared, but it may be preferably 1 to 100$\mu$, more preferably 1 to 80$\mu$, most preferably 2 to 50$\mu$.

In the present invention, the second amorphous layer (II) is provided on the first amorphous layer (I) as a layer containing primarily a-Si(H,X).

That is, the second amorphous layer (II) is constituted of any of the amorphous material represented by the above formula (1) (hereinafter abbreviated as "SiC"), the amorphous material represented by the formula (2) (hereinafter abbreviated as "a-SiCH"), the amorphous material represented by the above formula (3) (hereinafter abbreviated as "a-SiCX") or the amorphous material represented by the above formula (4) (hereinafter abbreviated as a-SiC(H+X)).

Formation of the second amorphous layer (II) constituted of a-SiC(H,X) may be performed according to the glow discharge method, the sputtering method, the ion implantation method, the ion plating method, the electron beam method, etc. These preparation methods may be suitably selected depending on various factors such as the preparation conditions, the extent of the load for capital investment for installations, the production scale, the desirable characteristics required for the photoconductive member to be prepared, etc. For the advantages of relatively easy control of the preparation conditions for preparing photoconductive members having desired characteristics and easy introduction of carbon atoms and, optionally hydrogen atoms or halogen atoms, together with silicon atoms (Si) into the second amorphous layer (II) to be prepared, there may preferably be employed the electron beam method, the ion plating method, the glow discharge method or the sputtering method.

For formation of a second amorphous layer (II) constituted of a-SiC by the sputtering method, a single crystalline or polycrystalline Si wafer or C wafer or a wafer containing a mixture of Si and C is used as target and subjected to sputtering in an atomosphere of various gases.

For example, when both of Si wafer and C wafer are used as target, a gas for sputtering such as He, Ne, Ar, etc. is introduced into a deposition chamber for sputter to form a gas plasma therein and effect sputtering of said Si wafer and C wafer.

Alternatively, by use of one sheet target formed as a mixture of Si and C, a gas for sputtering is introduced into a device system and sputtering is effected in the atomosphere of said gas.

When the electron beam method is employed, a single crystalline or polycrystalline high purity silicon and a high purity graphite may be placed in two vapor deposition boats, respectively, and vapor deposition may be effected at the same time independently of each other with electron beam, or alternatively vapor deposition may be effected with a single electron beam using silicon and graphite placed in the same vapor deposition boat. The composition ratio of silicon atoms to nitrogen atoms in the second amorphous layer (II) may be controlled, in the former case, by varying the acceleration voltage of electron beam relative to silicon and graphite, respectively, while in the latter case, by determining previously the mixed amounts of silicon and graphite. When the ion plating method is employed, various gases are introduced into a vapor deposition tank and a high frequency electric field is applied on a coil previously wound around the vapor deposition tank to form a gas plasma therein, under which state Si and C may be vapor deposited by utilization of the electron beam method.

For formation of the second amorphous layer (II) constituted of a-SiCH according to the glow discharge method, starting gases for formation of a-SiCH, which may optionally be mixed with a diluting gas at a predetermined mixing ratio, may be introduced into a deposition chamber for vacuum deposition in which a support is placed, and glow discharge is excited in said deposition chamber to form the gases introduced into a gas plasma, thereby depositing a-SiCH on the first amorphous layer (I) already formed on hte support.

In the present invention, as starting gases for formation of a-SiCH, there may be employed most of substances containing at least one of Si, C and H as constituent atoms which are gaseous or gasified substances of readily gasifiable ones.

When a starting gas containing Si as one of Si, C and H, there may be employed, for example, a mixture of a starting gas containing Si as constituent atom, a starting gas containing C as constituent atom and a starting gas containing H as constituent atom at a desired mixing ratio, or a mixture of a starting gas containing Si as constituent atom and a starting gas containing C and H as constituent atoms also at a desired ratio, or a mixture of a starting gas containing Si as constituent atom and a starting gas containing three constituent atoms of Si, C and H.

Alternatively, it is also possible to use a mixture of a starting gas containing Si and H as consituent atoms with a starting gas containing C as constituent atom.

In the present invention, the starting gases effectively used for formation of the second amorphous layer (II) may include hydrogenated silicon gases containing Si and H as constituent atoms such as silanes (e.g. $SiH_4$, $Si_2H_6$, $Si_3H_8$, $Si_4H_{10}$, etc.), compounds containing C and H as constituent atoms such as saturated hydrocarbons having 1 to 5 carbon atoms, ethylenic hydrocarbons having 2 to 5 carbon atoms and acetylenic hydrocarbons having 2 to 4 carbon atoms.

More specifically, there may be included, as saturated hydrocarbons, methane ($CH_4$), ethane ($C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2 ($C_4H_8$), isobutylene ($C_4H_8$), pentene ($C_5H_{10}$); as acetylenic hydrocarbons, acetylene ($C_2H_2$), methyl acetylene ($C_3H_4$), butyne ($C_4H_6$); and the like.

As the starting gas containing Si, C and H as constituent atoms, there may be mentioned alkyl silanes such as $Si(CH_3)_4$, $Si(C_2H_5)_4$ and the like. In addition to these starting gases, it is also possible as a matter of course to use $H_2$ as effective starting gas for introduction of H.

For formation of the second amorphous layer (II) constituted of a-SiCH according to the sputtering method, a single crystalline or polycrystalline Si wafer or C wafer or a wafer containing Si and C mixed therein is used as target and subjected to sputtering in an atmosphere of various gases.

For example, when Si wafer is used as target, starting gases for introducing C and H, which may be diluted with a diluting gas, if desired, are introduced into a deposition chamber for sputter to form a gas plasma of these gases therein and effect sputtering of said Si wafer.

Alternatively, Si and C as separate targets or one sheet target of a mixture of Si and C can be used and sputtering is effected in a gas atmosphere cantaining at least hydrogen atoms.

As the starting gas for introduction of C or H, there may be employed those as mentioned in the glow discharge as described above as effective gases also in case of sputtering.

For formation of the second amorphous layer (II) constituted of a-SiCX according to the glow discharge method, starting gases for formation of a-SiCX, which may optionally be mixed with a diluting gas at a predetermined mixing ratio, may be introduced into a deposition chamber for vacuum deposition in which a support is placed, and glow discharge is excited in said deposition chamber to form the gases introduced into a gas plasma, thereby depositing a-SiCX on the first amorphous layer (I) already formed on the support.

In the present invention, as the starting materials which can be effectively used as the starting gases for formation of a-SiCX, there may be employed most of substances containing at least one of Si, C and X as constituent atoms which are gaseous or gasified substances of readily gasifiable ones.

When a starting gas containing Si as one of Si, C and X, there may be employed, for example, a mixture of a starting gas containing Si as constituent atom, a starting gas containing C as constituent atom and a starting gas containing X as constitutent atom at a desired mixing ratio, or a mixture of a starting gas containing Si as constituent atom and a starting gas containing C and X as constituent atoms also at a desired ratio, or a mixture of a starting gas containing Si as constituent atom and a starting gas containing three constituent atoms of Si, C and X.

Alternatively, it is also possible to use a mixture of a starting gas containing Si and X as constituent atoms with a starting gas containing C as constituent atom.

In the present invention, preferable halogen atoms (X) to be contained in the second amorphous layer (II) are F, Cl, Br and I. Particularly, F and Cl are preferred.

In the present invention, when the second amorphous layer (II) is constituted of a-SiCX, it is also possible to $ further incorporate hydrogen atoms thereinto. In this case, incorporation of hydrogen atoms into the second amorphous layer (II) is convenient from aspect of production cost, because a part of starting gas species can be made common in forming continuous layers together with the first amorphous layer (I).

In the present invention, as the starting gases effectively employed for constitution of the second amorphous layer (II) of a-SiCX or a-SiC(H+X), there may be included, in addition to the starting gases mentioned in case of a-SiCH, single halogen substances, hydrogen halides, interhalogen compounds, silicon halides, halo-substituted hydrogenated silicons, hydrogenated silicons and the like.

More specifically, there may be mentioned, as single halogen substances, halogen gases such as of fluorine, chlorine, bromine and iodine; as hydrogen halides, FH, HI, HCl, HBr; as interhalogen compounds, BrF, $ClF_3$, $ClF_5$, $BrF_5$, $BrF_3$, $IF_7$, $IF_5$, ICl, IBr; as silicon halides, $SiF_4$, $Si_2F_6$, $SiCl_4$, $SiCl_3Br$, $SiCl_2Br_2$, $SiClBr_3$, $SiCl_3I$, $SiBr_4$, as halo-substituted hydrogenated silicon, $SiH_2F_2$, $SiH_2Cl_2$, $SiHCl_3$, $SiH_3Cl$, $SiH_3Br$, $SiH_2Br_2$, $SiHBr_3$ and so on.

In addition to these materials, there may also be employed halo-substituted paraffinic hydrocarbons such as $CCl_4$, $CHF_3$, $CH_2F_2$, $CH_3F$, $CH_3Cl$, $CH_3Br$, $CH_3I$, $C_2H_5Cl$ and the like, fluorinated sulfur compounds such as $SF_4$, $SF_6$, and the like, and halo-containing alkyl silanes (e.g. $SiCl(CH_3)_3$, $SiCl_2(CH_3)_2$, $SiCl_3CH_3$ and the like, as effective materials.

For formation of the second amorphous layer (II) constituted of a-SiCX or a-SiC(H-X) according to the sputtering method, a single crystalline or polycrystalline Si wafer or C wafer or a wafer containing Si and C mixed therein is used as target and subjected to sputtering in an atmosphere of various gases containing halogen atoms and, optionally hydrogen atoms, as constitutne atoms.

For example, when Si wafer is used as target, a starting gas for introducing C and X, which may be diluted with a diluting gas, if desired, is introduced into a deposition chamber for sputtering to form a gas plasma of these gases therein and effect sputtering of said Si wafer.

Alternatively, Si and C as separate targets or one sheet target of a mixture of Si and C can be used and sputtering is effected in a gas atmosphere containing at least halogen atoms. As the starting gas for introduction of C and X, and optionally H, there may be employed the substances for formation of the second amorphous layer (II) as mentioned in the glow discharge as described above as effective gases also in case of sputtering.

In the present invention, the starting materials for formation of the above second amorphous layer (II) may be selected and employed as desired in formation of the second amorphous layer (II) so that silicon atoms, carbon atoms and optionally hydrogen atoms or/and halogen atoms may be contained at a predetermined composition ratio in the second amorphous layer (II) to be formed.

For example, $Si(CH_3)_4$ as the material capable of incorporating easily silicon atoms, carbon atoms and hydrogen atoms and forming a second amorphous layer (II) having desired characteristics and $SiHCl_3$, $SiCl_4$, $SiH_2Cl_2$ or $SiH_3Cl$ as the material for incorporating halogen atoms may be mixed at a predetermined mixing ratio and introduced under gaseous state into a device for formation of a second amorphous layer (II), followed by excitation of glow discharge, whereby there can be formed a second amorphous layer (II) comprising a-$Si_xC_{1-x}$:Cl:H.

In the present invention, as the diluting gas to be used in forming the second amorphous layer (II) by the glow discharge method or the sputtering method, there may preferably employed so-called rare gases such as He, Ne, Ar and the like.

The second amorphous layer (II) in the present invention should be carefully formed so that the required characteristics may be given exactly as desired.

That is, the above amorphous material constituting the second amorphous layer (II) can take various electrical properties from conductive through semi-conductive to insulating and photoconductive properties from photoconductive to non-photoconductive depending on the preparation conditions. Therefore, in the present invention, the preparation conditions are strictly selected as desired so that there may be formed the aforesaid amorphous material having desired characteristics depending on the purpose.

For example, when the second amorphous layer (II) is to be provided primarily for the purpose of improvement of electric pressure resistance, the aforesaid amorphous material is prepared as an amorphous material having marked electric insulating behaviours under the usage conditions.

Alternatively, when the primary purpose for provision of the second amorphous layer (II) is improvement of continuous repeated use characteristics or environmental use characteristics, the degree of the above electric insulating property may be alleviated to some extent and the aforesaid amorphous material may be prepared as an amorphous material having sensitivity to some extent to the light irradiated.

In forming the second amorphous layer (II) comprising the aforesaid amorphous material on the surface of the first amorphous layer (I), the support temperature during layer formation is an important factor having influences on the structure and the characteristics of the layer to be formed, and it is desired in the present invention to control severely the support temperature during layer formation so that the second amorphous layer (II) having intended characteristics may be prepared as desired.

As the support temperature in forming the second amorphous layer (II) for accomplishing effectively the objects in the present invention, there may be selected suitably the optimum temperature range in conformity with the method for forming the second amorphous layer (II) in carying out formation of the second amorphous layer (II). When the second amorphous layer (II) is to be formed of a-SiC, the support temperature may preferably be 20° to 300° C., more preferably 20° to 250° C. When the second amorphous layer (II) is to be formed of other amorphous materials, the support temperature may preferably be 100° to 350° C., more preferably 150° to 250° C.

For formation of the second amorphous layer (II), the sputtering method or the electron beam may be advantageously adopted, because severe control of the composition ratio of atoms constituting the layer or control of layer thickness can be conducted with relative ease as compared with other methods. In case when the second amorphous layer (II) is to be formed according to these layer forming methods, the discharging power during layer formation is one of important factors influencing the characteristics of the above amorphous material to be prepared, similarly as the aforesaid support temperature.

The discharging power condition for preparing effectively the above amorphous material constituted of a-SiC having characteristics for accomplishing the objects of the present invention with good productivity may preferably be 50 W to 250 W, most preferably 80 W to 150 W. In case of other amorphous materials for formation of the second amorphous layer (II), the discharging power conditions may preferably be 10 to 300 W, more preferably 20 to 200 W.

In case of the present invention, the gas pressure in a deposition chamber formation of the second amorphous layer (II) may be generally be 0.01 to 1 Torr, preferably 0.1 to 0.5 Torr.

In the present invention, the above numerical ranges may be mentioned as preferable numerical ranges for the support temperature, discharging power for preparation of the second amorphous layer (II). However, these factors for layer formation should not be determined separately independently of each other, but it is desirable that the optimum values of respective layer forming factors should be determined based on mutual organic relationships so that the second amorphous layer (II) comprising the above amorphous material having desired characteristics may be formed.

The respective contents of carbon atoms, hydrogen atoms and halogen atoms in the second amorphous layer (II) in the photoconductive member of the present invention are important factors for obtaining the desired characteristics to accomplish the objects of the present invention, similarly as the conditions for preparation of the second amorphous layer (II).

The contents of respective atoms in the above amorphous layer constituting the second amorphous layer in the present invention may be generally within the ranges as specified above, but better results may be obtained when they are within the following ranges.

That is, in case of $Si_aC_{1-a}$, a may be preferably 0.4 to 0.99999, more preferably 0.5 to 0.99, most preferably 0.5 to 0.9. In case of $(Si_bC_{1-b})_cH_{1-c}$, b may be preferably 0.5 to 0.99999, more preferably 0.5 to 0.99, most preferably 0.5 to 0.9, and c preferably 0.6 to 0.99, more preferably 0.65 to 0.98, most preferably 0.7 to 0.95. In case of $(Si_dC_{1-d})_eX_{1-e}$ and $(Si_fC_{1-f})_g(H+X)_{1-g}$, d and f may be preferably 0.53 to 0.9999, more preferably 0.5 to 0.99, most preferably 0.8 to 0.9, while e and g may be preferably 0.8 to 0.99, more preferably 0.82 to 0.99, most preferably 0.85 to 0.98.

In case of $(Si_fC_{1-f})_g(H+X)_{1-g}$, the content of hydrogen atoms may be 19 atomic % or less, more preferably 13 atomic % or less.

The range of the numerical value of layer thickness of the second amorphous layer (II) should desirably be determined depending on the intended purpose so as to effectivelly accomplish the objects of the present invention.

The layer thickness of the second amorphous layer (II) is also required to be determined as desired suitably with due considerations about the relationships with the contents of carbon atoms, hydrogen atoms or halogen atoms, the layer thickness of the first amorphous layer (I), as well as other organic relationships with the characteristics required for respective layer regions. In addition, it is also desirable to have considerations from economical point of view such as productivity or capability of mass production.

The second amorphous layer (II) in the present invention is desired to have a layer thickness generally of 0.003 to 30μ, preferably 0.004 to 20μ, most preferably 0.005 to 10μ.

The support to be used in the present invention may be either electroconductive or insulating. As the electroconductive support, there may be mentioned metals such as NiCr, stainless steel, Al, Cr, Mo, Au, Nb, Ta, V, Ti, Pt, Pd etc. or alloys thereof.

As insulating supports, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. These insulating supports may preferably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, In₂O₃, SnO₂, ITO (In₂O₃+SnO₂) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The support may be shaped in any form such as cylinders, belts, plates or others, and its form may be determined as desired. For example, when the photoconductive member 100 in FIG. 1 is to be used as an image forming member for electrophotography, it may desirably be formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be exhibited. However, in such a case, the thickness is generally 10μ or more from the points of fabrication and handling of the support as well as its mechanical strength.

The photoconductive member of the present invention designed to have the layer constitution as described above can overcome all of the problems as mentioned above and exhibit very excellent electrical, optical, and photoconductive characteristics, as well as good environmental characteristics in use.

In particular, when it is applied as an image forming member for electrophotography, it is excellent in charge retentivity in charging treatment without any influence of residual potential on image formation at all, being stable in its electrical properties with high sensitivity and having high SN ratio as well as excellent light fatigue resistance and repeated usage characteristics, whereby it is possible obtain repeatedly images of high quality with high concentration, clear halftone and high resolution.

Next, the process for producing the photoconductive member formed according to the glow discharge decomposition method is to be described.

Figure 10:
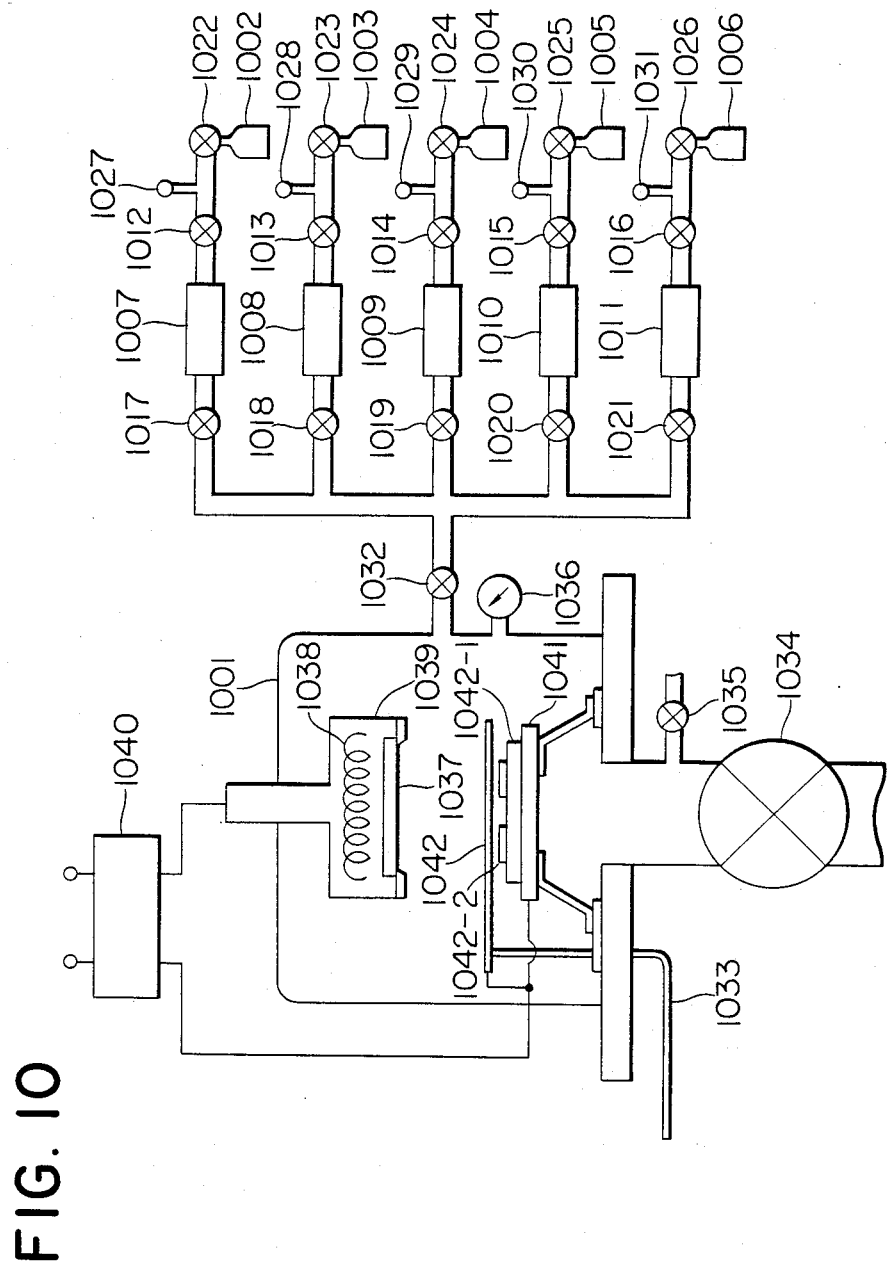
FIG. 10 a schematic flow chart for illustration of the device used for preparation of the photoconductive members of the present invention.

FIG. 10 shows one example of a device for producing a photoconductive member according to the present invention.

In the gas bombs 1002–1006 there are hermetically contained starting gases for formation of respective layers of the present invention. For example, 1002 is a bomb containing SiH₄ gas (purity:99.999%) diluted with He (hereinafter abbreviated as "SiH₄/He"), 1003 is a bomb containing B₂H₆ gas (purity:99.999%) diluted with He (hereinafter abbreviated as "B₂H₆/He"), 1004 is an NO gas bomb (purity: 99.99%), 1005 is an Ar gas bomb, and 1006 is a bomb containing SiF₄ (purity: 99.999%) diluted with He (hereinafter abbreviated as "SiF₄/He").

For allowing these gases to flow into the reaction chamber 1001, on confirmation of the valves 1022–1026 of the gas bombs 1002–1006 and the leak valve 1035 to be closed, and the inflow valves 1012–1016, the outflow valves 1017–1021 and the auxiliary valves 1032, 1033 to be opened, the main valve 1034 is first opened to evacuate the reaction chamber 1001 and the gas pipelines.

As the next step, when the reading on the vacuum indicator 1036 becomes $5\times10^{-6}$ Torr, the auxiliary valve 1032, the inflow valves 1012–1016, and the outflow valves 1017–1021 are closed.

Then, the valves of the gas pipelines connected to the bombs of the gases to be introduced into the reaction chamber 1001 are operated as scheduled to introduce the desired gases into the reaction chamber.

In the following, one example of preparing a photoconductive member having the same layer constitution as shown in FIG. 1 is to be briefly described.

For forming the first amorphous layer (I) on a predetermined support 1037 according to the sputtering method, the shutter 1042 is closed in the first place, SiH₄/He gas from the gas bomb 1002, B₂H₆/He gas from the gas bomb 1003 and NO gas from the gas bomb 1004 are permitted to flow into the mass-flow controllers 1007–1009 by opening the valves 1022–1024, respectively, and controlling the pressures at the outlet pressure gauges 1027–1029 to 1 kg/cm² and opening gradually the inflow valves 1012–1014. Subsequently, the outflow valves 1017–1019 and the auxiliary valve 1032 are gradually opened to permit respective gases to flow into the reaction chamber 1001. The outflow valves 1017–1019 are controlled so that the relative flow rate ratios between SiH₄/He, B₂H₆/He and NO gases may have desired values and opening of the main valve 1034 is also controlled while watching the reading on the vacuum indicator 1036 so that the pressure in the reaction chamber may reach a desired value.

And, after confirming that the temperature of the substrate cylinder 1037 is set at 50°-400° C. by the heater 1038, the power source 1040 is turned on at a desired power to excite glow discharge in the reaction chamber 1001, while simultaneously performing the operation to change gradually the flow rates of $B_2H_6$/He gas and NO gas in accordance with a previously designed change ratio curve to form a first amorphous layer (I).

As the species of the starting gas to be employed for formation of the amorphous layer (I), other than $SiH_4$ gas, $Si_2H_6$ gas is particularly effective for improvement of the layer formation speed.

When halogen atoms are to be incorporated in the first amorphous layer (I), other gases such as $SiF_4$/He are further added to the above gases and charged into the reaction chamber 1001.

Formation of the second layer (II) on the first amorphous layer (I) may be carried out, for example, as follows. First, the shutter 1042 is opened. All the gas supplying valves are once closed, the reaction chamber 1001 is evacuated by full opening of the main valve 1034.

On the electrode 1041 on which high power is to be applied, there are provided targets of a high purity silicon wafer 1042-1 and a high purity graphite wafer 1042-2 with a desired area ratio. From the gas bomb 1005, Ar gas is introduced into the reaction chamber 1001, and the main valve 1034 is controlled so that the inner pressure in the reaction chamber 1001 may become 0.05 to 1 Torr. The high voltage power source 1040 is turned on to effect sputtering on the aforesaid target, whereby the second amorphous layer (II) can be formed on the first amorphous layer (I).

The content of the carbon atoms to be contained in the second amorphous layer (II) can be controlled as desired by controlling the area ratio of the silicon wafer to the graphite wafer, or the mixing ratio of the silicon powders to the graphite powders during preparation of the target.

The present invention is further illustrated by referring to the following Examples.

EXAMPLE 1

By means of the device as shown in FIG. 10, there were prepared image forming members for electrophotography, each having a first amorphous layer (I) of the layer constitution as shown in FIG. 2, whith boron atoms (B) and oxygen atoms (0) in the layer as parameters, on an aluminum substrate. The common conditions are shown in Table 1A below.

The results of evaluation of respective samples are shown in Table 2A, in which the axis of ordinate indicates the boron content $C_{(III)1}$ and the axis of abscissa the oxygen content $C_{(O)1}$, respectively.

The image forming members prepared were evaluated comprehensively by superiority or inferiority of density, resolution gradation reproducibility and the like of the image visualized on a transfer paper after a series of electrophotographic process of charging-image wise exposure-development-transfer.

TABLE 1A

| Layer constitution | | Gases employed (Vol %) | Flow rate (SCCM) | Layer formation speed (Å/S) | Layer thickness (μ) | Discharging power (W/cm²) |
|---|---|---|---|---|---|---|
| Amorphous layer (I) | Layer region ($t_1t_B$) | $SiH_4$/He = 0.5<br>NO 100<br>$B_2H_6$/He = 3 × 10⁻³ | $SiH_4$ = 200 suitably changed depending on samples | 16 | 20 | 0.2 |
| | Layer region ($t_St_1$) | $SiH_4$/He = 0.5<br>NO 100<br>$B_2H_6$/He = 3 × 10⁻³ | $SiH_4$ = 200 suitably changed continuously | 16 | 1 | 0.2 |
| Amorphous layer (II) | | Ar | 200 | 5 | 0.5 | 0.3 |

Substrate temperature: 250° C.
Discharging frequency: 13.56 MHz
Inner pressure of reaction chamber: amorphous layer (I) 0.3 Torr
Inner pressure of reaction chamber: amorphous layer (II) 0.2 Torr

TABLE 2A

| Concentration C (O) atm % | Distribution C (III) 1 atm. ppm | | | | | | | | | | | |
|---|---|---|---|---|---|---|---|---|---|---|---|---|
| | 0.1 | 0.5 | 1 | 5 | 10 | 30 | 50 | 80 | 100 | 200 | 400 | 800 |
| 0.01 | 1-1 Δ | 1-2 Δ | 1-3 Δ | 1-4 ○ | 1-5 ○ | 1-6 Δ | 1-7 Δ | 1-8 Δ | 1-9 Δ | 1-10 Δ | 1-11 Δ | 1-12 Δ |
| 0.03 | 2-1 Δ | 2-2 Δ | 2-3 Δ | 2-4 ○ | 2-5 ○ | 2-6 Δ | 2-7 Δ | 2-8 Δ | 2-9 Δ | 2-10 Δ | 2-11 Δ | 2-12 Δ |
| 0.05 | 3-1 Δ | 3-2 Δ | 3-3 Δ | 3-4 ○ | 3-5 ○ | 3-6 ○ | 3-7 Δ | 3-8 Δ | 3-9 Δ | 3-10 Δ | 3-11 Δ | 3-12 Δ |
| 0.1 | 4-1 Δ | 4-2 Δ | 4-3 Δ | 4-4 ○ | 4-5 ○ | 4-6 ○ | 4-7 ○ | 4-8 Δ | 4-9 Δ | 4-10 Δ | 4-11 Δ | 4-12 Δ |
| 0.3 | 5-1 Δ | 5-2 Δ | 5-3 Δ | 5-4 ○ | 5-5 ○ | 5-6 ○ | 5-7 ○ | 5-8 ○ | 5-9 ○ | 5-10 ○ | 5-11 Δ | 5-12 Δ |
| 0.5 | 6-1 Δ | 6-2 Δ | 6-3 Δ | 6-4 ○ | 6-5 ⊙ | 6-6 ⊙ | 6-7 ⊙ | 6-8 ○ | 6-9 ○ | 6-10 ○ | 6-11 Δ | 6-12 Δ |
| 1 | 7-1 Δ | 7-2 Δ | 7-3 Δ | 7-4 ○ | 7-5 ⊙ | 7-6 ⊙ | 7-7 ⊙ | 7-8 ⊙ | 7-9 ○ | 7-10 ○ | 7-11 Δ | 7-12 Δ |
| 2 | 8-1 Δ | 8-2 Δ | 8-3 | 8-4 | 8-5 | 8-6 | 8-7 | 8-8 | 8-9 | 8-10 | 8-11 | 8-12 Δ |

TABLE 2A-continued

| Concentration C (O) atm % | Distribution C (III) 1 atm. ppm | | | | | | | | | | | |
|---|---|---|---|---|---|---|---|---|---|---|---|---|
| | 0.1 | 0.5 | 1 | 5 | 10 | 30 | 50 | 80 | 100 | 200 | 400 | 800 |
| 3.5 | 9-1 ○ | 9-2 ○ | 9-3 ○ | 9-4 ⊙ | 9-5 ⊙ | 9-6 ⊙ | 9-7 ⊙ | 9-8 ⊙ | 9-9 ⊙ | 9-10 ⊙ | 9-11 ○ | 9-12 Δ |
| 5 | 10-1 ○ | 10-2 ○ | 10-3 ○ | 10-4 ○ | 10-5 ○ | 10-6 ⊙ | 10-7 ⊙ | 10-8 ⊙ | 10-9 ⊙ | 10-10 ○ | 10-11 ○ | 10-12 Δ |
| 7 | 11-1 Δ | 11-2 ○ | 11-3 ○ | 11-4 ○ | 11-6 ○ | 11-7 ○ | 11-8 ⊙ | 11-9 ⊙ | 11-10 ⊙ | 11-11 ○ | 11-12 Δ | Δ |
| 10 | 12-1 Δ | 12-2 Δ | 12-3 ○ | 12-4 ○ | 12-5 ○ | 12-6 ○ | 12-7 ○ | 12-8 ⊙ | 12-9 ⊙ | 12-10 ○ | 12-11 Δ | 12-12 Δ |
| 20 | 13-1 Δ | 13-2 Δ | 13-3 Δ | 13-4 ○ | 13-5 ○ | 13-6 ○ | 13-7 ○ | 13-8 ○ | 13-9 ○ | 13-10 ○ | 13-11 Δ | 13-12 Δ |
| 30 | 14-1 Δ | 14-2 Δ | 14-3 Δ | 14-4 Δ | 14-5 Δ | 14-6 Δ | 14-7 Δ | 14-8 Δ | 14-9 Δ | 14-10 Δ | 14-11 Δ | 14-12 Δ |

Sample No.
Evaluation

Evaluation criteria
⊙: Excellent
○: Good
Δ: Practically satisfactory

EXAMPLE 2

By means of the device as shown in FIG. 10, there were prepared image forming members for electrophotography, each having a first amorphous layer (I) of the layer constitution as shown in FIG. 3, with boron atoms (B) and oxygen atoms (O) in the layer as parameters, on an aluminum substrate. The conditions for preparation of the respective layers are shown in Table 3A below. (Other conditions were the same as in Example 1)
Distribution concentration of oxygen $C_{(O)1}$ ... 3.5 atomic %
Distribution concentration of boron $C_{(III)1}$ ... 80 atomic ppm
Using the image forming member for electrophotography obtained, toner images were formed repeatedly on transfer papers by applying electrophotographic process similarly as in Example 1, whereby toner transferred images of high quality could be obtained stably.

EXAMPLE 3

By means of the device as shown in FIG. 10, there were prepared image forming members for electrophotography, each having a first amorphous layer (I) of the layer constitution as shown in FIG. 4, with boron atoms (B) and oxygen atoms (O) in the layer as parameters, on an aluminum substrate. The conditions for preparation of the respective layers are shown in Table 4A below. (Other conditions were the same as in Example 2)
Distribution concentration of oxygen $C_{(O)1}$ ... 7 atomic %
Distribution concentration of boron $C_{(III)1}$ ... 30 atomic ppm
Using the image forming member for electrophotography obtained, toner images were formed repeatedly on transfer papers by applying electrophotographic process similarly as in Example 1, whereby toner transferred images of high quality could be obtained stably.

TABLE 3A

| Layer constitution | | Gases employed | Flow rate (SCCM) | Flow rate ratio (or area ratio) | Layer formation speed (Å/S) | Layer thickness (μ) | Discharging power (W/cm²) |
|---|---|---|---|---|---|---|---|
| Amorphous layer (I) | Layer region ($t_2 t_B$) | SiH₄/He = 0.5<br>NO 100<br>B₂H₆/He = 3 × 10⁻³ | SiH₄ = 200 | NO/SiH₄ = 4 × 10⁻²<br><br>B₂H₆/SiH₄ = 8 × 10⁻⁵ | 20 | 20 | 0.18 |
| | Layer region ($t_1 t_2$) | SiH₄/He = 0.5<br>NO 100<br>B₂H₆/He = 3 × 10⁻³ | SiH₄ = 200 | NO/SiH₄ = 4 × 10⁻²<br>∼2 × 10⁻²<br>B₂H₆/SiH₄ = 8 × 10⁻⁵ | 20 | 0.5 | 0.18 |
| | Layer region ($t_5 t_1$) | SiH₄/He = 0.5<br>NO 100<br>B₂H₆/He = 3 × 10⁻³ | SiH₄ = 200 | NO/SiH₄ = 2 × 10⁻² ∼0<br>B₂H₆/SiH₄ = 8 × 10⁻⁵<br>∼0 | 20 | 0.5 | 0.18 |
| Amorphous layer (II) | | Ar | 200 | Siwafer:Graphite = 5:1 | 5 | 0.3 | 0.3 |

TABLE 4A

| Amorphous Layer constitution (I) | Gases employed (Vol %) | Flow rate (SCCM) | Flow rate ratio | Layer formation speed (Å/S) | Layer thickness (μ) | Discharging power (W/cm²) |
|---|---|---|---|---|---|---|
| Layer region ($t_2 t_B$) | SiH₄/He = 0.5<br>NO 100<br>B₂H₆/He = 3 × 10⁻³ | SiH₄ = 200 | NO/SiH₄ = 8 × 10⁻²<br><br>B₂H₆/SiH₄ = 3 × 10⁻⁵ | 20 | 20 | 0.2 |
| Layer region ($t_1 t_2$) | SiH₄/He = 0.5<br>NO 100<br>B₂H₆/He = 3 × 10⁻³ | SiH₄ = 200 | NO/SiH₄ = 8 × 10⁻²<br>B₂H₆/SiH₄ = 3.0 × 10⁻⁵<br>∼1.5 × 10⁻⁵ | 20 | 0.5 | 0.2 |

TABLE 4A-continued

| Amorphous Layer constitution (I) | Gases employed (Vol %) | Flow rate (SCCM) | Flow rate ratio | Layer formation speed (Å/S) | Layer thickness (μ) | Discharging power (W/cm$^2$) |
| --- | --- | --- | --- | --- | --- | --- |
| Layer region ($t_5t_1$) | SiH$_4$/He = 0.5<br>NO 100<br>B$_2$H$_6$/He = 3 × 10$^{-3}$ | SiH$_4$ = 200 | NO/SiH$_4$ = 8 × 10$^{-2}$ ~ 0<br>B$_2$H$_6$/SiH$_4$ = 1.5 × 10$^{-5}$ ~ 0 | 20 | 0.5 | 0.2 |

EXAMPLE 4

Image forming members were prepared according to entirely the same procedures as in Example 2 except that the content ratio of silicon atoms to carbon atoms was varied by varying the area ratio of silicon wafer to graphite during formation of the second amorphous layer (II). The image forming members thus obtained were subjected to image evaluation after repeating the steps of image formation, development and cleaning as described in Example 1 for about 50,000 times, to obtain the results as shown in Table 5A.

TABLE 5A

| Si:C Target area ratio | 9:1 | 6.5:3.5 | 4:6 | 1.7:8.3 | 1:9 |
| --- | --- | --- | --- | --- | --- |
| Si:C Content ratio | 9.7:0.3 | 8.8:1.2 | 7.3:2.7 | 4.5:5.5 | 3.1:6.9 |
| Image evaluation | ○ | ⊙ | ⊙ | ○ | Δ |

⊙: Very good
○: Good
Δ: Practically useful, but ground fog on white ground and peel-off of layers slightly formed

EXAMPLE 5

Image forming members were prepared according to entirely the same procedures as in Example 2 except that the thickness of the second amorphous layer (II) was varied. The steps of image formation, development and cleaning as described in Example 1 were repeated to obtain the results as shown in Table 6A.

TABLE 6A

| Thickness of amorphous layer (II) (μ) | Results |
| --- | --- |
| 0.001 | Liable to form image defect |
| 0.02 | No image defect during 20,000 repetitions |
| 0.05 | Stable for 50,000 repetitions |
| 1 | Stable for 200,000 repetitions |

EXAMPLE 6

By means of the device as shown in FIG. 10, there were prepared image forming members for electrophotography, each having a first amorphous layer (I) of the layer constitution as shown in FIG. 5, with boron atoms (B) and oxygen atoms (O) in the layer as parameters, on an aluminum cylinder substrate.

The conditions for preparation of the respective layer regions constituting the first amorphous layer (I) are shown in Table 7A below. (Other conditions were the same as in Example 2)

Distribution concentration of oxygen $C_{(O)1}$ ... 7 atomic %
Distribution concentration of boron $C_{(III)1}$ ... 10 atomic ppm
Distribution concentration of boron $C_{(III)3}$ ... shown in Table 8A Using the respective image forming members for electrophotography obtained, toner images were formed repeatedly on transfer papers by applying electrophotographic process similarly as in Example 1, whereby evaluations as shown in Table 8A could be obtained.

In Table 7A, X(4) means the following value for each sample indicated in Table 8A.

| S4-1 | 1 × 10$^{-7}$ | S4-2 | 5 × 10$^{-7}$ |
| --- | --- | --- | --- |
| S4-3 | 1 × 10$^{-6}$ | S4-4 | 5 × 10$^{-6}$ |

TABLE 7A

| Amorphous layer constitution (I) | Gases employed (Vol %) | Flow rate (SCCM) | Flow rate ratio | Layer formation speed (Å/S) | Layer thickness (μ) | Discharging power (W/cm$^2$) |
| --- | --- | --- | --- | --- | --- | --- |
| Layer region ($t_2t_B$) | SiH$_4$/He = 0.5<br>NO 100<br>B$_2$H$_6$/He = 3 × 10$^{-3}$ | SiH$_4$ = 200 | NO/SiH$_4$ = 8 × 10$^{-2}$<br>B$_2$H$_6$/SiH$_4$ = 1 × 10$^{-5}$ | 18 | 20 | 0.18 |
| Layer region ($t_1t_2$) | SiH$_4$/He = 0.5<br>NO 100<br>B$_2$H$_6$/He = 3 × 10$^{-3}$ | SiH$_4$ = 200 | NO/SiH$_4$ = 8 × 10$^{-2}$ ~ 5 × 10$^{-2}$<br>B$_2$H$_6$/SiH$_4$ = 1 × 10$^{-5}$ | 18 | 0.5 | 0.18 |
| Layer region ($t_5t_1$) | SiH$_4$/He = 0.5<br>NO 100<br>B$_2$H$_6$/He = 3 × 10$^{-3}$ | SiH$_4$ = 200 | NO/SiH$_4$ = 5 × 10$^{-2}$ ~ 0<br>B$_2$H$_6$/SiH$_4$ = 1 × 10$^{-5}$ ~ X(4)* | 18 | 0.3 | 0.18 |

TABLE 8A

| Example | Distribution (III) 3 of B | | | | | | | | |
| --- | --- | --- | --- | --- | --- | --- | --- | --- | --- |
| | 0.1 | 0.5 | 1 | 5 | 10 | 20 | 40 | 80 | 100 |
| 6 | S4-1<br>Δ | S4-2<br>○ | S4-3<br>○ | S4-4<br>⊙ | | | | | |
| 7 | S5-1<br>Δ | S5-2<br>○ | S5-3<br>○ | S5-4<br>⊙ | S5-5<br>⊙ | S5-6<br>○ | S5-7<br>○ | S5-8<br>Δ | S5-9<br>Δ |
| 8 | S6-1<br>○ | S6-2<br>○ | S6-3<br>⊙ | S6-4<br>⊙ | S6-5<br>⊙ | S6-6<br>○ | | | |
| 9 | S7-1<br>○ | S7-2<br>○ | S7-3<br>⊙ | S7-4<br>⊙ | S7-5<br>⊙ | S7-6<br>○ | S7-7<br>○ | S7-8<br>Δ | S7-9<br>Δ |
| Sample No. | | | | | | | | | |

TABLE 8A-continued

| Example | Distribution (III) 3 of B | | | | | | | |
|---|---|---|---|---|---|---|---|---|
| | 0.1 | 0.5 | 1 | 5 | 10 | 20 | 40 | 80 | 100 |

-continued

| | | | | | |
|---|---|---|---|---|---|
| S5-7 | $2.5 \times 10^{-5}$ | S5-8 | $3.5 \times 10^{-5}$ | S5-9 | $6 \times 10^{-5}$ |

TABLE 9A

| Amorphous Layer constitution (I) | Gases employed (Vol %) | Flow rate (SCCM) | Flow rate ratio | Layer formation speed (Å/S) | Layer thickness ($\mu$) | Discharging power (W/cm$^2$) |
|---|---|---|---|---|---|---|
| Layer region ($t_2t_B$) | $SiH_4/He = 0.5$<br>NO 100<br>$B_2H_6/He = 3 \times 10^{-3}$ | $SiH_4 = 200$ | $NO/SiH_4 = 1.1 \times 10^{-2}$<br><br>$B_2H_6/SiH_4 = 8 \times 10^{-5}$ | 20 | 20 | 0.2 |
| Layer region ($t_1t_2$) | $SiH_4/He = 0.5$<br>NO 100<br>$B_2H_6/He = 3 \times 10^{-3}$ | $SiH_4 = 200$ | $NO/SiH_4 = 1.1 \times 10^{-2}$<br>$\sim 7.4 \times 10^{-3}$<br>$B_2H_6/SiH_4 = 8 \times 10^{-5}$<br>$\sim X(5)$ | 20 | 1.0 | 0.2 |
| Layer region ($t_St_1$) | $SiH_4/He = 0.5$<br>NO 100<br>$B_2H_6/He = 3 \times 10^{-3}$ | $SiH_4 = 200$ | $NO/SiH_4 = 7.4 \times 10^{-3}$<br>$\sim 0$<br>$B_2H_6/SiH_4 = X(5)$ | 20 | 0.5 | 0.2 |

Evaluation

Evaluation criteria are the same as in Table 2A

EXAMPLE 7

By means of the device as shown in FIG. 10, there were prepared image forming members for electrophotography, each having a first amorphous layer (I) of the layer constitution as shown in FIG. 6, with boron atoms (B) and oxygen atoms (O) in the layer as parameters, on an aluminum substrate.

The conditions for preparation of the respective layer regions constituting the first amorphous layer (I) are shown in Table 9A below. (Other conditions were the same as in Example 2)

Distribution concentration of oxygen $C_{(O)1}$ ... 1 atomic %

Distribution concentration of boron $C_{(III)1}$ ... 100 atomic ppm

Distribution concentration of boron $C_{(III)3}$ ... shown in Table 8A

Using the respective image forming members for electrophotography obtained, toner images were formed repeatedly on transfer papers by applying electrophotographic process similarly as in Example 1, whereby evaluations as shown in Table 8A could be obtained.

In Table 9A, X(5) means the following value for each sample indicated in Table 8A:

| | | | | | |
|---|---|---|---|---|---|
| S5-1 | $1 \times 10^{-7}$ | S5-2 | $5 \times 10^{-7}$ | S5-3 | $1 \times 10^{-6}$ |
| S5-4 | $5 \times 10^{-6}$ | S5-5 | $1 \times 10^{-5}$ | S5-6 | $1 \times 10^{-5}$ |

EXAMPLE 8

By means of the device as shown in FIG. 10, there were prepared image forming members for electrophotography, each having a first amorphous layer (I) of the layer constitution as shown in FIG. 7, with boron atoms (B) and oxygen atoms (O) in the layer as parameters, on an aluminum substrate.

The conditions for preparation of the respective layer regions constituting the first amorphous layer (I) are shown in Table 10A below. (Other conditions were the same as in Example 2)

Distribution concentration of oxygen $C_{(O)1}$ ... 2 atomic %

Distribution concentration of boron $C_{(III)1}$ ... 30 atomic ppm

Distribution concentration of boron $C_{(III)3}$ ... shown in Table 8A

Using the respective image forming members for electrophotography obtained, toner images were formed repeatedly on transfer papers by applying electrophotographic process similarly as in Example 1, whereby evaluations as shown in Table 8A could be obtained.

In Table 10A, X(6) means the following value for each sample indicated in Table 8A:

| | | | |
|---|---|---|---|
| S6-1 | $1 \times 10^{-7}$ | S6-2 | $5 \times 10^{-7}$ |
| S6-3 | $1 \times 10^{-6}$ | S6-4 | $5 \times 10^{-6}$ |
| S6-5 | $1 \times 10^{-5}$ | S6-6 | $2 \times 10^{-5}$ |

TABLE 10A

| Amorphous Layer constitution (I) | Gases employed (Vol %) | Flow rate (SCCM) | Flow rate ratio | Layer formation speed (Å/S) | Layer thickness ($\mu$) | Discharging power (W/cm$^2$) |
|---|---|---|---|---|---|---|
| Layer region ($t_2t_B$) | $SiH_4/He = 0.5$<br>NO 100<br>$B_2H_6/He = 3 \times 10^{-3}$ | $SiH_4 = 200$ | $NO/SiH_4 = 2.2 \times 10^{-2}$<br><br>$B_2H_6/SiH_4 = 3 \times 10^{-5}$ | 20 | 20 | 0.2 |
| Layer region ($t_1t_2$) | $SiH_4/He = 0.5$<br>NO 100<br>$B_2H_6/He = 3 \times 10^{-3}$ | $SiH_4 = 200$ | $NO/SiH_4 = 2.2 \times 10^{-2}$<br>$\sim 1.38 \times 10^{-2}$<br>$B_2H_6/SiH_4 = 3 \times 10^{-5}$ | 20 | 0.5 | 0.2 |
| Layer region ($t_St_1$) | $SiH_4/He = 0.5$<br>NO 100<br>$B_2H_6/He = 3 \times 10^{-3}$ | $SiH_4 = 200$ | $NO/SiH_4 = 1.38 \times 10^{-2}$<br>$\sim 0$<br>$B_2H_6/SiH_4 = 3 \times 10^{-5}$<br>$\sim X(6)$ | 20 | 0.3 | 0.2 |

EXAMPLE 9

By means of the device as shown in FIG. 10, there were prepared image forming members for electrophotography, each having a first amorphous layer (I) of the layer constitution as shown in FIG. 8, with boron atoms (B) and oxygen atoms (O) in the layer as parameters, on an aluminum substrate.

The conditions for preparation of the respective layer regions constituting the first amorphous layer (I) are shown in Table 11A below. (Other conditions were the same as in Example 2)

Distribution concentration of oxygen $C_{(O)1}$ ... 2 atomic %

Distribution concentration of boron $C_{(III)1}$ ... 200 atomic ppm

Distribution concentration of boron $C_{(III)3}$ ... shown in Table 8A Using the respective image forming member for electrophotography obtained, toner images were formed repeatedly on transfer papers by applying electrophotographic process similarly as in Example 1, whereby evaluations as shown in Table 8A could be obtained. In Table 11A, X(7) means the following:

| | | | |
|---|---|---|---|
| S7-1 | $1 \times 10^{-7}$ | S7-2 | $5 \times 10^{-7}$ |
| S7-3 | $1 \times 10^{-6}$ | S7-4 | $5 \times 10^{-6}$ |
| S7-5 | $1 \times 10^{-5}$ | S7-6 | $2 \times 10^{-5}$ |
| S7-7 | $4 \times 10^{-5}$ | S7-8 | $8 \times 10^{-5}$ |
| S7-9 | $1 \times 10^{-4}$ | | | layer region (t2, t3) as parameters, on an aluminum substrate.

The conditions for preparation of the respective layer regions constituting the first amorphous layer (I) are shown in Table 12A below. (Other conditions were the same as in Example 2)

Distribution concentration of oxygen $C_{(O)1}$ ... 7 atomic %

Distribution concentration of boron $C_{(III)1}$ ... 100 atomic ppm

Using the respective image forming members for electrophotography obtained, toner images were formed repeatedly on transfer papers by applying electrophotographic process similarly as in Example 1, whereby evaluations as shown in Table 13A could be obtained.

TABLE 12A

| Amorphous layer constitution (I) | Gases employed (Vol %) | Flow rate (SCCM) | Flow rate ratio | Layer formation speed (Å/S) | Layer thickness (μ) | Discharging power (W/cm²) |
|---|---|---|---|---|---|---|
| Layer region ($t_2 t_B$) | SiH$_4$/He = 0.5<br>NO 100<br>B$_2$H$_6$/He = 3 × 10$^{-3}$ | SiH$_4$ = 200 | NO/SiH = 7.7 × 10$^{-2}$<br>B$_2$H$_6$/SiH$_4$ = 8 × 10$^{-5}$ | 20 | 20 | 0.2 |
| Layer region ($t_1 t_2$) | SiH$_4$/He = 0.5<br>NO 100<br>B$_2$H$_6$/He = 3 × 10$^{-3}$ | SiH$_4$ = 200 | NO/SiH$_4$ = 7.7 × 10$^{-2}$ ~ 3.85 × 10$^{-2}$<br>B$_2$H$_6$/SiH$_4$ = 8 × 10$^{-5}$ ~ 0 | 20 | 0.5 | 0.2 |
| Layer region ($t_s t_1$) | SiH$_4$/He = 0.5<br>NO 100 | SiH$_4$ = 200 | NO/SiH$_4$ = 3.85 × 10$^{-2}$ ~ 0 | 20 | 0.5 | 0.2 |

TABLE 13A

| Layer region | Layer region ($t_1 t_2$) (μ) | | | | |
|---|---|---|---|---|---|
| ($t_2 t_3$) (μ) | 0.1 | 0.5 | 1.0 | 4 | 8 |
| 0.1 | S8-11 ○ | S8-12 ○ | S8-13 ○ | S8-14 ○ | S8-15 ⊚ |
| 0.2 | S8-21 ○ | S8-22 ⊚ | S8-23 ⊚ | S8-24 ⊚ | S8-25 ⊚ |
| 1.0 | S8-31 ○ | S8-32 ⊚ | S8-33 ⊚ | S8-34 ⊚ | S8-35 ⊚ |
| 4 | S8-41 ⊚ | S8-42 ⊚ | S8-43 ⊚ | S8-44 ⊚ | S8-45 ⊚ |
| 8 | S8-51 | S8-52 | S8-53 | S8-54 | S8-55 |

Sample No.
Evaluation

Evaluation criteria are the same as in Table 2A

TABLE 11A

| Amorphous layer constitution (I) | Gases employed (Vol %) | Flow rate (SCCM) | Flow rate ratio | Layer formation speed (Å/S) | Layer thickness (μ) | Discharging power (W/cm²) |
|---|---|---|---|---|---|---|
| Layer region ($t_2 t_B$) | SiH$_4$/He = 0.5<br>NO 100<br>B$_2$H$_6$/He = 3 × 10$^{-3}$ | SiH$_4$ = 200 | NO/SiH$_4$ = 2.2 × 10$^{-2}$<br>B$_2$H$_6$/SiH$_4$ = 2 × 10$^{-4}$ | 20 | 20 | 0.2 |
| Layer region ($t_1 t_2$) | SiH$_4$/He = 0.5<br>NO 100<br>B$_2$H$_6$/He = 3 × 10$^{-3}$ | SiH$_4$ = 200 | NO/SiH$_4$ = 2.2 × 10$^{-2}$ ~ 1.47 × 10$^{-2}$<br>B$_2$H$_6$/SiH$_4$ = 2 × 10$^{-4}$ ~ X(7) | 20 | 0.3 | 0.2 |
| Layer region ($t_s t_1$) | SiH$_4$/He = 0.5<br>NO 100<br>B$_2$H$_6$/He = 3 × 10$^{-3}$ | SiH$_4$ = 200 | NO/SiH$_4$ = 1.47 × 10$^{-2}$ ~ 0<br>B$_2$H$_6$/SiH$_4$ = X(7) | 20 | 1.0 | 0.2 |

EXAMPLE 10

By means of the device as shown in FIG. 10, there were prepared image forming members for electrophotography, each having a first amorphous layer (I) of the layer constitution as shown in FIG. 9, with the respective layer thickness of the layer region (t1, t2) and the

EXAMPLE 11

By means of the device as shown in FIG. 10, there were prepared image forming members for electrophotography, each having a first amorphous layer (I) of the layer constitution as shown in FIG. 2, with boron atoms (B) and oxygen atoms (O) in the layer as parameters, on an aluminum substrate.

The conditions for preparation of the respective layer regions constituting the first amorphous layer (I) are shown in Table 14A below. (Other conditions were the same as in Example 2)

Distribution concentration of oxygen $C_{(O)1}$ ... 3.5 atomic %

Distribution concentration of boron $C_{(III)1}$ ... 80 atomic ppm

Distribution concentration of boron $C_{(III)2}$ ... 500 atomic ppm

Using the image forming members for electrophotography obtained, toner images were formed repeatedly on transfer papers by applying electrophotographic process similarly as in Example 1, whereby toner transferred images of high quality could be obtained stably.

TABLE 14A

| Amorphous layer constitution (I) | Gases employed (Vol %) | Flow rate (SCCM) | Flow rate ratio | Layer formation speed (Å/S) | Layer thickness (μ) | Discharging power (W/cm²) |
|---|---|---|---|---|---|---|
| Layer region ($t_3t_B$) | $SiH_4/He = 0.5$<br>NO 100<br>$B_2H_6/He = 3.3 \times 10^{-3}$ | $SiH_4 = 200$ | $NO/SiH_4 = 4 \times 10^{-2}$<br>$B_2H_6/SiH_4 = 5 \times 10^{-4}$ | 20 | 0.3 | 0.2 |
| Layer region ($t_1t_3$) | $SiH_4/He = 0.5$<br>NO 100<br>$B_2H_6/He = 3.3 \times 10^{-3}$ | $SiH_4 = 200$ | $NO/SiH_4 = 4 \times 10^{-2}$<br>$B_2H_6/SiH_4 = 8 \times 10^{-5}$ | 20 | 20 | 0.2 |
| Layer region ($t_5t_1$) | $SiH_4/He = 0.5$<br>NO 100<br>$B_2H_6/He = 3.3 \times 10^{-3}$ | $SiH_4 = 200$ | $NO/SiH_4 = 4 \times 10^{-2} \sim 0$<br>$B_2H_6/SiH_4 = 8 \times 10^{-5} \sim 0$ | 20 | 1 | 0.2 |

EXAMPLE 12

By means of the device as shown in FIG. 11, an image forming member for electrophotography having a first amorphous layer (I) of the layer constitution as shown in FIG. 3 was formed on an aluminum substrate.

The conditions for preparation of the respective layer regions constituting the first amorphous layer (I) and the second amorphous layer (II) are shown in Table 1B below.

Distribution concentration of oxygen $C_{(O)1}$ ... 3.5 atomic %

Distribution concentration of boron $C_{(III)1}$ ... 80 atomic ppm

The image forming member prepared was evaluated comprehensively by superiority or inferiority of density, resolution, gradation reproducibility and the like of the image visualized on a transfer paper after a series of electrophotographic process of charging-image wise exposure-development-transfer.

TABLE 1B

| | Layer constitution | Gases employed (Vol %) | Flow rate (SCCM) | Flow rate ratio | Layer formation speed (Å/S) | Layer thickness (μ) |
|---|---|---|---|---|---|---|
| Amorphous layer (I) | First layer region ($t_2t_B$) | $SiH_4/He = 0.5$<br>NO 100<br>$B_2H_6/He = 3 \times 10^{-3}$ | $SiH_4 = 200$ | $NO/SiH_4 = 4 \times 10^{-2}$<br>$B_2H_6/SiH_4 = 8 \times 10^{-5}$ | 20 | 20 |
| | Second layer region ($t_1t_2$) | $SiH_4/He = 0.5$<br>NO 100<br>$B_2H_6/He = 10^{-3}$ | $SiH_4 = 200$ | $NO/SiH_4 = 4 \times 10^{-2} \sim 2 \times 10^{-2}$<br>$B_2H_6/SiH_4 = 8 \times 10^{-5}$ | 20 | 0.5 |
| | Third layer region ($t_5t_1$) | $SiH_4/He = 0.5$<br>NO 100<br>$B_2H_6/He = 3 \times 10^{-3}$ | $SiH_4 = 200$ | $NO/SiH_4 = 2 \times 10^{-2} \sim 0$<br>$B_2H_6/SiH_4 = 8 \times 10^{-5} \sim 0$ | 20 | 0.5 |
| Amorphous layer (II) | | $SiH_4/He = 0.5$<br>$C_2H_4$ | $SiH_4 = 100$ | $SiH_4:C_2H_4 = 5:5$ | 6 | 3 |

Al substrate temperature: 250° C.
Discharging frequency: 13.56 MHz
Inner pressure in reaction chamber: 0.5 Torr
Discharging power: 0.18 W/cm²

EXAMPLE 13

Image forming members were prepared according to entirely the same procedures as in Example 12 except that the content ratio of silicon atoms to carbon atoms was varied by varying the flow rate ratio of $SiH_4$ gas to $C_2H_4$ gas during formation of the second amorphous layer (II) to obtain the results as shown in Table 2B.

TABLE 2B

| Si:C Content ratio | 9.8:0.2 | 9.0:1.0 | 7.6:2.4 | 5.0:5.0 | 2.8:7.2 |
|---|---|---|---|---|---|
| Image evaluation | ○ | ○ | ○ | ○ | Δ |

○: Good

Δ: Liable to form image defect

EXAMPLE 14

Image forming members were prepared according to entirely the same procedures as in Example 12 except that the thickness of the second amorphous layer (II) was varied. The steps of image formation, development and cleaning as described in Example 12 were repeated to obtain the results as shown below.

TABLE 3B

| Thickness of amorphous layer (II) (μ) | Results |
|---|---|
| 0.001 | Liable to form image defect |
| 0.02 | No image defect during 20,000 repetitions |
| 0.05 | Stable for 20,000 repetitions or more |
| 1 | Stable for 100,000 repetitions or more |

EXAMPLE 15

By means of the device as shown in FIG. 10, an image forming member for electrophotography having a first amorphous layer (I) of the layer constitution as shown in FIG. 4 was formed on an aluminum cylinder.

The conditions for preparation of the respective layer regions constituting the first amorphous layer (I) and the second amorphous layer (II) are shown in Table 4B below.

Distribution concentration of oxygen $C_{(O)1}$ ... 7 atomic %

Distribution concentration of boron $C_{(III)1}$ ... 30 atomic ppm

Using the image forming member for electrophotography obtained, toner images were formed repeatedly on transfer papers by applying electrophotographic process similarly as in Example 12, whereby transferred toner images of high quality could be obtained stably.

TABLE 4B

| Layer constitution | | Gases employed (Vol %) | Flow rate (SCCM) | Flow rate ratio | Layer formation speed (Å/S) | Layer thickness (μ) |
|---|---|---|---|---|---|---|
| Amorphous layer (I) | First layer region ($t_2t_B$) | $SiH_4/He = 0.5$<br>NO 100<br>$B_2H_6/He = 3 \times 10^{-3}$ | $SiH_4 = 200$ | $NO/SiH_4 = 8 \times 10^{-2}$<br>$B_2H_6/SiH_4 = 3 \times 10^{-5}$ | 20 | 20 |
| | Second layer region ($t_1t_2$) | $SiH_4/He = 0.5$<br>NO 100<br>$B_2H_6/He = 3 \times 10^{-3}$ | $SiH_4 = 200$ | $NO/SiH_4 = 8 \times 10^{-2}$<br>$B_2H_6/SiH_4 = 3.0 \times 10^{-5} \sim 1.5 \times 10^{-5}$ | 20 | 0.5 |
| | Third layer region ($t_st_1$) | $SiH_4/He = 0.5$<br>NO 100<br>$B_2H_6/He = 3 \times 10^{-3}$ | $SiH_4 = 200$ | $NO/SiH_4 = 8 \times 10^{-2} \sim 0$<br>$B_2H_6/SiH_4 = 1.5 \times 10^{-5} \sim 0$ | 20 | 0.5 |
| Amorphous layer (II) | | $SiH_4/He = 0.5$<br>$C_2H_4$ | $SiH_4 = 100$ | $SiH_4:C_2H_4 = 5:5$ | 6 | 3 |

Al substrate temperature: 250° C.
Discharging frequency: 13.56 MHz
Inner pressure in reaction chamber: 0.5 Torr
Discharging power: 0.2 W/cm²

EXAMPLE 16

By means of the device as shown in FIG. 10, an image forming member for electrophotography having a first amorphous layer (I) of the layer constitution as shown in FIG. 5 was formed on an aluminum substrate.

The conditions for preparation of the respective layer regions constituting the first amorphous layer (I) and the second amorphous layer (II) are shown in Table 5B below.

Distribution concentration of oxygen $C_{(O)1}$ ... 7 atomic %

Distribution concentration of boron $C_{(III)1}$ ... 10 atomic ppm

Distribution concentration of boron $C_{(III)3}$ ... 5 atomic %

Using the image forming member for electrophotography obtained, toner images were formed repeatedly on transfer papers by applying electrophotgraphic process similarly as in Example 12, whereby transferred toner images of high quality could be obtained stably.

TABLE 5B

| Layer constitution | | Gases employed (Vol %) | Flow rate (SCCM) | Flow rate ratio | Layer formation speed (Å/S) | Layer thickness (μ) |
|---|---|---|---|---|---|---|
| Amorphous layer (I) | First layer region ($t_5t_B$) | $SiH_4/He = 0.5$<br>NO 100<br>$B_2H_6/He = 3 \times 10^{-3}$ | $SiH_4 = 200$ | $NO/SiH_4 = 8 \times 10^{-2}$<br>$B_2H_6 = 1 \times 10^{-5}$ | 18 | 20 |
| | Second layer region ($t_4t_5$) | $SiH_4/He = 0.5$<br>NO 100<br>$B_2H_6/He = 3 \times 10^{-3}$ | $SiH_4 = 200$ | $NO/SiH_4 = 8 \times 10^{-2} \sim 5 \times 10^{-2}$<br>$B_2H_6/SiH_4 = 1 \times 10^{-5}$ | 18 | 0.5 |
| | Third layer region ($t_3t_4$) | $SiH_4/He = 0.5$<br>NO 100<br>$B_2H_6/He = 3 \times 10^{-3}$ | $SiH_4 = 200$ | $NO/SiH_4 = 5 \times 10^{-2} \sim 0$<br>$B_2H_6/SiH_4 = 1 \times 10^{-5} \sim 5 \times 10^{-6}$ | 18 | 0.3 |
| Amorphous layer (II) | | $SiH_4/He = 0.5$<br>$C_2H_4$ | $SiH_4 = 100$ | $SiH_4:C_2H_4 = 5:5$ | 6 | 3 |

Al substrate temperature: 250° C.
Discharging frequency: 13.56 MHz
Inner pressure in reaction chamber: 0.5 Torr
Discharging power: 0.18 W/cm²

EXAMPLE 17

By means of the device as shown in FIG. 10, an image forming member for electrophotography having a first amorphous layer (I) of the layer constitution as shown in FIG. 6 was formed on an aluminum cylinder.

The conditions for preparation of the respective layer regions constituting the first amorphous layer (I) and the second amorphous layer (II) are shown in Table 6B below.

Distribution concentration of oxygen $C_{(O)1}$ ... 1 atomic %

Distribution concentration of boron $C_{(III)1}$ ... 100 atomic ppm

Distribution concentration of boron $C_{(III)3}$ ... 10 atomic %

Using the image forming member for electrophotography obtained, toner images were formed repeatedly on transfer papers by applying electrophotographic process similarly as in Example 12, whereby transferred toner images of high quality could be obtained stably.

EXAMPLE 18

By means of the device as shown in FIG. 10, an image forming member for electrophotography having a first amorphous layer (I) of the layer constitution as shown in FIG. 7 was formed on an aluminum cylinder.

The conditions for preparation of the respective layer regions constituting the first amorphous layer (I) and the second amorphous layer (II) are shown in Table 7B below.

Distribution concentration of oxygen $C_{(O)1}$ ... 2 atomic %

Distribution concentration of boron $C_{(III)1}$ ... 30 atomic ppm

Distribution concentration of boron $C_{(III)3}$ ... 5 atomic %

Using the image forming member for electrophotography obtained, toner images were formed repeatedly on transfer papers by applying electrophotographic process similarly as in Example 12, whereby transferred toner images of high quality could be obtained stably.

TABLE 7B

| Layer constitution | | Gases employed (Vol %) | Flow rate (SCCM) | Flow rate ratio | Layer formation speed (Å/S) | Layer thickness (μ) |
|---|---|---|---|---|---|---|
| Amorphous layer (I) | First layer region ($t_2t_B$) | $SiH_4/He = 0.5$<br>NO 100<br>$B_2H_6/He = 3 \times 10^{-3}$ | $SiH_4 = 200$ | $NO/SiH_4 = 2.2 \times 10^{-2}$<br>$B_2H_6/SiH_4 = 3 \times 10^{-5}$ | 20 | 20 |
| | Second layer region ($t_1t_2$) | $SiH_4/He = 0.5$<br>NO 100<br>$B_2H_6/He = 3 \times 10^{-3}$ | $SiH_4 = 200$ | $NO/SiH_4 = 2.2 \times 10^{-2} \sim 1.38 \times 10^{-2}$<br>$B_2H_6/SiH_4 = 3 \times 10^{-5}$ | 20 | 0.5 |
| | Third layer region ($t_5t_1$) | $SiH_4/He = 0.5$<br>NO 100<br>$B_2H_6/He = 3 \times 10^{-3}$ | $SiH_4 = 200$ | $NO/SiH_4 = 1.38 \times 10^{-2} \sim 0$<br>$B_2H_6/SiH_4 = 3 \times 10^{-5} \sim 5 \times 10^{-6}$ | 20 | 0.3 |
| Amorphous layer (II) | | $SiH_4/He = 0.5$<br>$C_2H_4$ | $SiH_4 = 100$ | $SiH_4:C_2H_4 = 5:5$ | 6 | 3 |

Al substrate temperature: 250° C.
Discharging frequency: 13.56 MHz
Discharging power: 0.2 W/cm²
Inner pressure in reaction chamber: 0.5 Torr

EXAMPLE 19

By means of the device as shown in FIG. 10, an image forming member for electrophotography having a first amorphous layer (I) of the layer constitution as shown in FIG. 8 was formed on an aluminum cylinder.

The conditions for preparation of the respective layer regions constituting the first amorphous layer (I) and

TABLE 6B

| Layer constitution | | Gases employed (Vol %) | Flow rate (SCCM) | Flow rate ratio | Layer formation speed (Å/S) | Layer thickness (μ) |
|---|---|---|---|---|---|---|
| Amorphous layer (I) | First layer region ($t_2t_B$) | $SiH_4/He = 0.5$<br>NO 100<br>$B_2H_6/He = 3 \times 10^{-3}$ | $SiH_4 = 200$ | $NO/SiH_4 = 1.1 \times 10^{-2}$<br>$B_2H_6/SiH_4 = 1 \times 10^{-5}$ | 20 | 20 |
| | Second layer region ($t_1t_2$) | $SiH_4/He = 0.5$<br>NO 100<br>$B_2H_6/He = 3 \times 10^{-3}$ | $SiH_4 = 200$ | $NO/SiH_4 = 1.1 \times 10^{-2} \sim 7.4 \times 10^{-3}$<br>$B_2H_6/SiH_4 = 8.0 \times 10^{-5} \sim 1 \times 10^{-5}$ | 20 | 1.0 |
| | Third layer region ($t_5t_1$) | $SiH_4/He = 0.5$<br>NO 100<br>$B_2H_6/He = 3 \times 10^{-3}$ | $SiH_4 = 200$ | $NO/SiH_4 = 7.4 \times 10^{-3} \sim 0$<br>$B_2H_6/SiH_4 = 1 \times 10^{-5}$ | 20 | 0.5 |
| Amorphous layer (II) | | $SiH_4/He = 0.5$<br>$C_2H_4$ | $SiH_4 = 100$ | $SiH_4:C_2H_4 = 5:5$ | 6 | 3 |

Al substrate temperature: 250° C.
Discharging frequency: 13.56 MHz
Discharging power: 0.18 W/cm²
Inner pressure in reaction chamber: 0.5 Torr the second amorphous layer (II) are shown in Table 8B below.

Distribution concentration of oxygen $C_{(O)1}$ ... 2 atomic %

Distribution concentration of boron $C_{(III)1}$ ... 200 atomic ppm

Distribution concentration of boron $C_{(III)3}$ ... 5 atomic %

Using the image forming member for electrophotography obtained, toner images were formed repeatedly on transfer papers by applying electrophotographic process similarly as in Example 12, whereby transferred toner images of high quality could be obtained stably.

Distribution concentration of oxygen $C_{(O)3}$ ... 2 atomic %

Distribution concentration of boron $C_{(III)3}$ ... 50 atomic ppm

Using the image forming member for electrophotography obtained, toner images were formed repeatedly on transfer papers by applying electrophotographic process similarly as in Example 12, whereby transferred toner images of high quality could be obtained stably.

TABLE 9B

| Layer constitution | | Gases employed (Vol %) | Flow rate (SCCM) | Flow rate ratio | Layer formation speed (Å/S) | Layer thickness (μ) |
|---|---|---|---|---|---|---|
| Amorphous layer (I) | First layer region ($t_2t_B$) | $SiH_4/He = 0.5$<br>NO 100<br>$B_2H_6/He = 3 \times 10^{-3}$ | $SiH_4 = 200$ | $NO/SiH_4 = 1.1 \times 10^{-2}$<br>$B_2H_6/SiH_4 = 4 \times 10^{-5}$ | 20 | 20 |
| | Second layer region ($t_1t_2$) | $SiH_4/He = 0.5$<br>NO 100<br>$B_2H_6/He = 3 \times 10^{-3}$ | $SiH_4 = 200$ | $NO/SiH_4 = 1.1 \times 10^{-2} \sim 4.4 \times 10^{-3}$<br>$B_2H_6/SiH_4 = 4 \times 10^{-5} \sim 0$ | 20 | 0.5 |
| | Third layer region ($t_St_1$) | $SiH_4/He = 0.5$<br>NO 100<br>$B_2H_6/He = 3 \times 10^{-3}$ | $SiH_4 = 300$ | $NO/SiH_4 = 4.4 \times 10^{-3} \sim 0$ | 20 | 1 |
| Amorphous layer (II) | | $SiH_4/He = 0.5$<br>$C_2H_4$ | $SiH_4 = 100$ | $SiH_4:C_2H_4 = 5:5$ | 6 | 3 |

Al substrate temperature: 250° C.
Discharging frequency: 13.56 MHz
Discharging power: 0.2 W/cm²
Inner pressure in reaction chamber: 0.5 Torr raphy obtained, toner images were formed repeatedly on transfer papers by applying electrophotographic process similarly as in Example 12, whereby transferred toner images of high quality could be obtained stably.

EXAMPLE 21

By means of the device as shown in FIG. 10, an image forming member for electrophotography having a first

TABLE 8B

| Layer constitution | | Gases employed (Vol %) | Flow rate (SCCM) | Flow rate ratio | Layer formation speed (Å/S) | Layer thickness (μ) |
|---|---|---|---|---|---|---|
| Amorphous layer (I) | First layer region ($t_2t_B$) | $SiH_4/He = 0.5$<br>NO 100<br>$B_2H_6/He = 3 \times 10^{-3}$ | $SiH_4 = 200$ | $NO/SiH_4 = 2.2 \times 10^{-2}$<br>$B_2H_6/SiH_4 = 2 \times 10^{-4}$ | 20 | 20 |
| | Second layer region ($t_1t_2$) | $SiH_4/He = 0.5$<br>NO 100<br>$B_2H_6/He = 3 \times 10^{-3}$ | $SiH_4 = 200$ | $NO/SiH_4 = 2.2 \times 10^{-2} \sim 1.47 \times 10^{-2}$<br>$B_2H_6/SiH_4 = 2 \times 10^{-4} \sim 5 \times 10^{-6}$ | 20 | 0.3 |
| | Third layer region ($t_St_1$) | $SiH_4/He = 0.5$<br>NO 100<br>$B_2H_6/He = 3 \times 10^{-3}$ | $SiH_4 = 200$ | $NO/SiH_4 = 1.47 \times 10^{-2} \sim 0$<br>$B_2H_6/SiH_4 = 5 \times 10^{-6}$ | 20 | 1.0 |
| Amorphous layer (II) | | $SiH_4/He = 0.5$<br>$C_2H_4$ | $SiH_4 = 100$ | $SiH_4:C_2H_4 = 5:5$ | 6 | 3 |

Al substrate temperature: 250° C.
Discharging frequency: 13.56 MHz
Discharging power: 0.2 W/cm²
Inner pressure in reaction chamber: 0.5 Torr

EXAMPLE 20

By means of the device as shown in FIG. 10, an image forming member for electrophotography having a first amorphous layer (I) of the layer constitution as shown in FIG. 9 was formed on an aluminum cylinder.

The conditions for preparation of the respective layer regions constituting the first amorphous layer (I) and the second amorphous layer (II) are shown in Table 9B below.

Distribution concentration of oxygen $C_{(O)1}$ ... 5 atomic % amorphous layer (I) of the layer constitution as shown in FIG. 2 was formed on an aluminum cylinder.

The conditions for preparation of the respective layer regions constituting the first amorphous layer (I) and the second amorphous layer (II) are shown in Table 10B below.

Distribution concentration of oxygen $C_{(O)1}$ ... 3.5 atomic %

Distribution concentration boron $C_{(III)1}$ ... 80 atomic ppm

Distribution concentration of boron $C_{(III)2}$ ... 500 atomic ppm

Using the image forming member for electrophotography obtained, toner images were formed repeatedly on transfer papers by applying electrophotographic process similarly as in Example 12, whereby transferred toner images of high quality could be obtained stably.

TABLE 11B

| Layer constitution | | Gases employed (Vol %) | Flow rate (SCCM) | Flow rate ratio | Layer formation speed (Å/S) | Layer thickness (μ) |
|---|---|---|---|---|---|---|
| Amorphous layer (I) | First layer region ($t_2t_B$) | $SiH_4/He = 0.5$<br>$SiF_4/He = 0.5$<br>NO 100<br>$B_2H_6/He = 3 \times 10^{-3}$ | $SiH_4 = 200$ | $NO/(SiH_4 + SiF_4) = 4 \times 10^{-2}$<br>$SiF_4/SiH_4 = 0.2$<br>$B_2H_6/(SiH_4 + SiF_4) = 8 \times 10^{-5}$ | 20 | 20 |
| | Second layer region ($t_1T_2$) | $SiH_4/He = 0.5$<br>$SiF_4/He = 0.5$<br>NO 100<br>$B_2H_6/He = 3 \times 10^{-3}$ | $SiH_4 = 200$ | $NO/(SiH_4 + SiF_4) = 4 \times 10^{-2} \sim 2 \times 10^{-2}$<br>$SiF_4/SiH_4 = 0.2$<br>$B_2H_6/(SiH_4 + SiF_4) = 8 \times 10^{-5}$ | 20 | 0.5 |
| | Third layer region ($t_5t_1$) | $SiH_4/He = 0.5$<br>$SiF_4/He = 0.5$<br>NO 100<br>$B_2H_6/He = 3 \times 10^{-3}$ | $SiH_4 = 200$ | $NO/(SiH_4 + SiF_4) = 2 \times 10^{-2} \sim 0$<br>$SiF_4/SiH_4 = 0.2$<br>$B_2H_6/(SiH_4 + SiF_4) = 8 \times 10^{-5} \sim 0$ | 20 | 0.5 |
| Amorphous Layer (II) | | $SiH_4/He = 0.5$<br>$C_2H_4$ | $SiH_4 = 100$ | $SiH_4:C_2H_4 = 5:5$ | 6 | 3 |

Al substrate temperature: 250° C.
Discharging frequency: 13.56 MHz
Discharging power: 0.18 W/cm²
Inner pressure in reaction chamber: 0.5 Torr on transfer papers by applying electrophotographic process similarly as in Example 12, whereby transferred toner images of high quality could be obtained stably.

TABLE 10B

| Layer constitution | | Gases employed (Vol %) | Flow rate (SCCM) | Flow rate ratio | Layer formation speed (Å/S) | Layer thickness (μ) |
|---|---|---|---|---|---|---|
| Amorphous layer (I) | First layer region ($t_3t_B$) | $SiH_4/He = 0.5$<br>NO 100<br>$B_2H_6/He = 3.3 \times 10^{-3}$ | $SiH_4 = 200$ | $NO/SiH_4 = 4 \times 10^{-2}$<br>$B_2H_6/SiH_4 = 5 \times 10^{-4}$ | 20 | 0.3 |
| | Second layer region ($t_1t_3$) | $SiH_4/He = 0.5$<br>NO 100<br>$B_2H_6/He = 3.3 \times 10^{-3}$ | $SiH_4 = 200$ | $NO/SiH_4 = 4 \times 10^{-2}$<br>$B_2H_6/SiH_4 = 8 \times 10^{-5}$ | 20 | 20 |
| | Third layer region ($t_5t_1$) | $SiH_4/He = 0.5$<br>NO 100<br>$B_2H_6/He = 3.3 \times 10^{-3}$ | $SiH_4 = 200$ | $NO/SiH_4 = 4 \times 10^{-2} \sim 0$<br>$B_2H_6/SiH_4 = 8 \times 10^{-5} \sim 0$ | 20 | 1 |
| Amorphous layer (II) | | $SiH_4/He = 0.5$<br>$C_2H_4$ | $SiH_4 = 100$ | $SiH_4:C_2H_4 = 5:5$ | 6 | 3 |

Al substrate temperature: 250° C.
Discharging frequency: 13.56 MHz
Discharging power: 0.2 W/cm²
Inner pressure in reaction chamber: 0.5 Torr

EXAMPLE 22

By means of the device as shown in FIG. 10, an image forming member for electrophotography having a first amorphous layer (I) of the layer constitution as shown in FIG. 3 was formed on an aluminum substrate.

The conditions for preparation of the respective layer regions constituting the first amorphous layer (I) and the second amorphous layer (II) are shown in Table 11B below.

Distribution concentration of oxygen $C_{(O)1}$ . . . 3.5 atomic %

Distribution concentration of boron $C_{(III)1}$ . . . 80 atomic ppm

Using the image forming member for electrophotography obtained, toner images were formed repeatedly on transfer papers by applying electrophotographic process similarly as in Example 12, whereby transferred toner images of high quality could be obtained stably.

EXAMPLE 23

By means of the device as shown in FIG. 10, an image forming member for electrophotography having a first amorphous layer (I) of the layer constitution as shown in FIG. 3 was formed on an aluminum cylinder.

The conditions for preparation of the respective layer regions constituting the first amorphous layer (I) and the second amorphous layer (II) are shown in Table 1C below.

Distribution concentration of oxygen $C_{(O)1}$ . . . 3.5 atomic %

Distribution concentration of boron $C_{(III)1}$ . . . 80 atomic ppm

The image forming member prepared was evaluated comprehensively by superiority or inferiority of density, resolution and gradation reproducibility of the image visualized on a transfer paper after a series of electrophotographic process of charging-image wise exposure-development-transfer.

TABLE 1C

| Layer constitution | | Gases employed (Vol %) | Flow rate (SCCM) | Flow rate ratio | Layer formation speed (Å/S) | Layer thickness ($\mu$) |
|---|---|---|---|---|---|---|
| Amorphous layer (I) | First layer region ($t_2t_B$) | $SiH_4/He = 0.5$<br>$NO\ 100$<br>$B_2H_6/He = 3 \times 10^{-3}$ | $SiH_4 = 200$ | $NO/SiH_4 = 4 \times 10^{-2}$<br>$B_2H_6/SiH_4 = 8 \times 10^{-5}$ | 20 | 20 |
| | Second layer region ($t_1t_2$) | $SiH_4/He = 0.5$<br>$NO\ 100$<br>$B_2H_6/He = 3 \times 10^{-3}$ | $SiH_4 = 200$ | $NO/SiH_4 = 4 \times 10^{-2} \sim 2 \times 10^{-2}$ | 20 | 0.5 |
| | Third layer region ($t_5t_1$) | $SiH_4/He = 0.5$<br>$NO\ 100$<br>$B_2H_6/He = 3 \times 10^{-3}$ | $SiH_4 = 200$ | $NO/SiH_4 = 2 \times 10^{-2} \sim 0$<br>$B_2H_6/SiH_4 = 8 \times 10^{-5} \sim 0$ | 20 | 0.5 |
| Amorphous layer (II) | | $SiH_4/He = 0.5$<br>$SiF_4/He = 0.5$<br>$C_2H_4$ | $SiH_4 + SiF_4 = 150$ | $SiH_4:SiF_4:C_2H_4 = 4:2:4$ | 8 | 2 |

Al substrate temperature: 250° C.
Discharging frequency: 13.56 MHz
Discharging power: 0.18 W/cm$^2$
Inner pressure in reaction chamber: 0.5 Torr

EXAMPLE 24

Image forming members were prepared according to entirely the same procedures as in Example 23 except that the content ratio of silicon atoms to carbon atoms was varied by varying the flow rate ratio of ($SiH_4 \pm SiF_4$) gas to $C_2H_4$ gas during formation of the second amorphous layer (II) to obtain the results as shown in Table 2C.

TABLE 2C

| Si:C (Content ratio) | 9.7:0.3 | 8.8:1.2 | 7.3:2.7 | 4.7:5.3 | 3.1:6.9 |
|---|---|---|---|---|---|
| Image evaluation | ○ | ○ | ○ | ○ | Δ |

○: Good
Δ: Liable to form image defect

EXAMPLE 25

Image forming members were prepared according to entirely the same procedures as in Example 23 except that the thickness of the second amorphous layer (II) was varied. The steps of image formation, development and cleaning as described in Example 23 were repeated to obtain the results as shown below.

TABLE 3C

| Thickness of amorphous layer (II) ($\mu$) | Results |
|---|---|
| 0.001 | Liable to form image defect |
| 0.02 | No image defect during 20,000 repetitions |
| 0.05 | Stable for 20,000 repetitions or more |
| 1 | Stable for 100,000 repetitions or more |

EXAMPLE 26

By means of the device as shown in FIG. 10, an image forming member for electrophotography having a first amorphous layer (I) of the layer constitution as shown in FIG. 4 was formed on an aluminum cylinder.

The conditions for preparation of the respective layer regions constituting the first amorphous layer (I) and the second amorphous layer (II) are shown in Table 4C below.

Distribution concentration of oxygen $C_{(O)1}$ ... 7 'atomic %

Distribution concentration of boron $C_{(III)1}$ ... 30 'atomic ppm

Using the image forming member for electrophotography obtained, toner images were formed repeatedly on transfer papers by applying electrophotographic process similarly as in Example 23, whereby transferred toner images of high quality could be obtained stably.

TABLE 4C

| Layer constitution | | Gases employed (Vol %) | Flow rate (SCCM) | Flow rate ratio | Layer formation speed (Å/S) | Layer thickness ($\mu$) |
|---|---|---|---|---|---|---|
| Amorphous layer (I) | First layer region ($t_2t_B$) | $SiH_4/He = 0.5$<br>$NO\ 100$<br>$B_2H_6/He = 3 \times 10^{-3}$ | $SiH_4 = 200$ | $NO/SiH_4 = 8 \times 10^{-2}$<br>$B_2H_6/SiH_4 = 3 \times 10^{-5}$ | 20 | 20 |
| | Second layer region ($t_1t_2$) | $SiH_4/He = 0.5$<br>$NO\ 100$<br>$B_2H_6/He = 3 \times 10^{-3}$ | $SiH_4 = 200$ | $NO/SiH_4 = 8 \times 10^{-2}$<br>$B_2H_6/SiH_4 = 3.0 \times 10^{-5} \sim 1.5 \times 10^{-5}$ | 20 | 0.5 |
| | Third layer region ($t_5t_1$) | $SiH_4/He = 0.5$<br>$NO\ 100$<br>$B_2H_6/He = 3 \times 10^{-3}$ | $SiH_4 = 200$ | $NO/SiH_4 = 8 \times 10^{-2} \sim 0$<br>$B_2H_6/SiH_4 = 1.5 \times 10^{-5} \sim 0$ | 20 | 0.5 |
| Amorphous | | $SiH_4/He = 0.5$ | $SiH_4 + SiF_4 = 150$ | $SiH_4:SiF_4:C_2H_4 = 3:3:4$ | 7 | 2 |

TABLE 4C-continued

| Layer constitution | Gases employed (Vol %) | Flow rate (SCCM) | Flow rate ratio | Layer formation speed (Å/S) | Layer thickness (μ) |
|---|---|---|---|---|---|
| layer (II) | $SiF_4/He = 0.5$ $C_2H_4$ | | | | |

Al substrate temperature: 250° C.
Discharging frequency: 13.56 MHz
Discharging power: 0.2 W/cm²
Inner pressure in reaction chamber: 0.5 Torr

EXAMPLE 27

By means of the device as shown in FIG. 10, an image forming member for electrophotography having a first amorphous layer (I) of the layer constitution as shown in FIG. 5 was formed on an aluminum cylinder.

The conditions for preparation of the respective layer regions constituting the first amorphous layer (I) and the second amorphous layer (II) are shown in Table 5C below.

Distribution concentration of oxygen $C_{(O)}$ ... 7 atomic %

Distribution concentration of boron $C_{(III)1}$ ... 10 atomic ppm

Distribution concentration of boron $C_{(III)3}$ ... 5 atomic %

Using the image forming member for electrophotography obtained, toner images were formed repeatedly on transfer papers by applying electrophotographic process similarly as in Example 23, whereby transferred toner images of high quality could be obtained stably.

EXAMPLE 28

By means of the device as shown in FIG. 10, an image forming member for electrophotography having a first amorphous layer (I) of the layer constitution as shown in FIG. 6 was formed on an aluminum cylinder.

The conditions for preparation of the respective layer regions constituting the first amorphous layer (I) and the second amorphous layer (II) are shown in Table 6C below.

Distribution concentration of oxygen $C_{(O)1}$ ... 1 atomic %

Distribution concentration of boron $C_{(III)1}$ ... 100 atomic ppm

Distribution concentration of boron $C_{(III)3}$ ... 10 atomic %

Using the image forming member for electrophotography obtained, toner images were formed repeatedly on transfer papers by applying electrophotographic process similarly as in Example 23, whereby transferred toner images of high quality could be obtained stably.

TABLE 5C

| Layer constitution | | Gases employed (Vol %) | Flow rate (SCCM) | Flow rate ratio | Layer formation speed (Å/S) | Layer thickness (μ) |
|---|---|---|---|---|---|---|
| Amorphous layer (I) | First layer region ($t_2t_B$) | $SiH_4/He = 0.5$ NO 100 $B_2H_6/He = 3 \times 10^{-3}$ | $SiH_4 = 200$ | $NO/SiH_4 = 8 \times 10^{-2}$ $B_2H_6/SiH_4 = 1 \times 10^{-5}$ | 18 | 20 |
| | Second layer region ($t_1t_2$) | $SiH_4/He = 0.5$ NO 100 $B_2H_6/He = 3 \times 10^{-3}$ | $SiH_4 = 200$ | $NO/SiH_4 = 8 \times 10^{-2} \sim 5 \times 10^{-2}$ $B_2H_6/SiH_4 = 1 \times 10^{-5}$ | 18 | 0.5 |
| | Third layer region ($t_5t_1$) | $SiH_4/He = 0.5$ NO 100 $B_2H_6/He = 3 \times 10^{-3}$ | $SiH_4 = 200$ | $NO/SiH_4 = 5 \times 10^{-2} \sim 0$ $B_2H_6/SiH_4 = 1 \times 10^{-5} \sim 5 \times 10^{-6}$ | 18 | 0.3 |
| Amorphous layer (II) | | $SiH_4/He = 0.5$ $SiF_4/He = 0.5$ $C_2H_4$ | $SiH_4 + SiF_4 = 150$ | $SiH_4:SiF_4:C_2H_4 = 3:2:5$ | 8 | 2 |

Al substrate temperature: 250° C.
Discharging frequency: 13.56 MHz
Discharging power: 0.18 W/cm²
Inner pressure in reaction chamber: 0.5 Torr

TABLE 6C

| Layer constitution | | Gases employed (Vol %) | Flow rate (SCCM) | Flow rate ratio | Layer formation speed (Å/S) | Layer thickness (μ) |
|---|---|---|---|---|---|---|
| Amorphous layer (I) | First layer region ($t_2t_B$) | $SiH_4/He = 0.5$ NO 100 $B_2H_6/He = 3 \times 10^{-3}$ | $SiH_4 = 200$ | $NO/SiH_4 = 1.1 \times 10^{-2}$ $B_2H_6/SiH_4 = 8 \times 10^{-5}$ | 20 | 20 |
| | Second layer region ($t_1t_2$) | $SiH_4/He = 0.5$ NO 100 $B_2H_6/He = 3 \times 10^{-3}$ | $SiH_4 = 200$ | $NO/SiH_4 = 1.1 \times 10^{-2} \sim 7.4 \times 10^{-3}$ $B_2H_6/SiH_4 = 8.0 \times 10^{-5} \sim 1 \times 10^{-5}$ | 20 | 1.0 |
| | Third layer region | $SiH_4/He = 0.5$ NO 100 $B_2H_6/He = 3 \times 10^{-3}$ | $SiH_4 = 200$ | $NO/SiH_4 = 7.4 \times 10^{-3} \sim 0$ $B_2H_6/SiH_4 = 1 \times 10^{-5}$ | 20 | 0.5 |

TABLE 6C-continued

| Layer constitution | Gases employed (Vol %) | Flow rate (SCCM) | Flow rate ratio | Layer formation speed (Å/S) | Layer thickness (μ) |
|---|---|---|---|---|---|
| ($t_S t_1$) Amorphous layer (II) | $SiH_4/He = 0.5$ $SiF_4/He = 0.5$ $C_2H_4$ | $SiH_4 = SiF_4 = 150$ | $SiH_4:SiF_4:C_2H_4 = 4:2:4$ | 8 | 2 |

Al substrate temperature: 250° C.
Discharging frequency: 13.56 MHz
Discharging power: 0.18 W/cm²
Inner pressure in reaction chamber: 0.5 Torr

EXAMPLE 29

By means of the device as shown in FIG. 10, an image forming member for electrophotography having a first amorphous layer (I) of the layer constitution as shown in FIG. 7 was formed on an aluminum cylinder.

The conditions for preparation of the respective layer regions constituting the first amorphous layer (I) and the second amorphous layer (II) are shown in Table 7C below.

Distribution concentration oxygen $C_{(O)1}$ ... 2 atomic %
Distribution concentration of boron $C_{(III)1}$ ... 30 atomic ppm
Distribution concentration of boron $C_{(III)3}$ ... 5 atomic %

Using the image forming member for electrophotography obtained, toner images were formed repeatedly on transfer papers by applying electrophotographic process similarly as in Example 23, whereby transferred toner images of high quality could be obtained stably.

EXAMPLE 30

By means of the device as shown in FIG. 10, an image forming member for electrophotography having a first amorphous layer (I) of the layer constitution as shown in FIG. 8 was formed on an aluminum cylinder.

The conditions for preparation of the respective layer regions constituting the first amorphous layer (I) and the second amorphous layer (II) are shown in Table 8C below.

Distribution concentration of oxygen $C_{(O)1}$ ... 2 atomic %
Distribution concentration of boron $C_{(III)1}$ ... 200 atomic ppm
Distribution concentration of boron $C_{(III)3}$ ... 5 atomic %

Using the image forming member for electrophotography obtained, toner images were formed repeatedly on transfer papers by applying electrophotographic process similarly as in Example 23, whereby transferred

TABLE 7C

| Layer constitution | | Gases employed (Vol %) | Flow rate (SCCM) | Flow rate ratio | Layer formation speed (Å/S) | Layer thickness (μ) |
|---|---|---|---|---|---|---|
| Amorphous layer (I) | First layer region ($t_2 t_B$) | $SiH_4/He = 0.5$ NO 100 $B_2H_6/He = 3 \times 10^{-3}$ | $SiH_4 = 200$ | $NO/SiH_4 = 2.2 \times 10^{-2}$ $B_2H_6/SiH_4 = 3 \times 10^{-5}$ | 20 | 20 |
| | Second layer region ($t_1 t_2$) | $SiH_4/He = 0.5$ NO 100 $B_2H_6/He = 3 \times 10^{-2}$ | $SiH_4 = 200$ | $NO/SiH_4 = 2.2 \times 10^{-2} \sim 1.38 \times 10^{-2}$ $B_2H_6/SiH_4 = 3.0 \times 10^{-5}$ | 20 | 0.5 |
| | Third layer region ($t_S t_1$) | $SiH_4/He = 0.5$ NO 100 $B_2H_6/He = 3 \times 10^{-3}$ | $SiH_4 = 200$ | $NO/SiH_4 = 1.38 \times 10^{-2} \sim 0$ $B_2H_6/SiH_4 = 3 \times 10^{-5} \sim 5 \times 10^{-6}$ | 20 | 0.3 |
| Amorphous layer (II) | | $SiH_4/He = 0.5$ $SiF_4/He = 0.5$ $C_2H_4$ | $SiH_4 + SiF_4 = 150$ | $SiH_4:SiF_4:C_2H_4 = 3:3:4$ | 7 | 2 |

Al substrate temperature: 250° C.
Discharging frequency: 13.56 MHz
Discharging power: 0.2 W/cm²
Inner pressure in reaction chamber: 0.5 Torr toner images of high quality could be obtained stably.

TABLE 8C

| Layer constitution | | Gases employed (Vol %) | Flow rate (SCCM) | Flow rate ratio | Layer formation speed (Å/S) | Layer thickness (μ) |
|---|---|---|---|---|---|---|
| Amorphous layer (I) | First layer region ($t_2 t_B$) | $SiH_4/He = 0.5$ NO 100 $B_2H_6/He = 3 \times 10^{-3}$ | $SiH_4 = 200$ | $NO/SiH_4 = 2.2 \times 10^{-2}$ $B_2H_6/SiH_4 = 2 \times 10^{-4}$ | 20 | 20 |
| | Second layer region ($t_1 t_2$) | $SiH_4/He = 0.5$ NO 100 $B_2H_6/He = 3 \times 10^{-3}$ | $SiH_4 = 200$ | $NO/SiH_4 = 2.2 \times 10^{-2} \sim 1.47 \times 10^{-2}$ $B_2H_6/SiH_4 = 2.0 \times 10^{-4} \sim 5 \times 10^{-6}$ | 20 | 0.3 |
| | Third | $SiH_4/He = 0.5$ | $SiH_4 = 200$ | $NO/SiH_4 = 1.47 \times 10^{-2} \sim 0$ | 20 | 1.0 |

TABLE 8C-continued

| Layer constitution | | Gases employed (Vol %) | Flow rate (SCCM) | Flow rate ratio | Layer formation speed (Å/S) | Layer thickness ($\mu$) |
|---|---|---|---|---|---|---|
| | layer region ($t_5t_1$) | NO 100<br>$B_2H_6/He = 3 \times 10^{-3}$ | | $B_2H_6/SiH_4 = 5 \times 10^{-6}$ | | |
| Amorphous layer (II) | | $SiH_4/He = 0.5$<br>$SiF_4/He = 0.5$<br>$C_2H_4$ | $SiH_4 + SiF_4 = 150$ | $SiH_4:SiF_4:C_2H_4 = 3:2:5$ | 8 | 2 |

Al substrate temperature: 250° C.
Discharging frequency: 13.56 MHz
Discharging power: 0.2 W/cm$^2$
Inner pressure in reaction chamber: 0.5 Torr

EXAMPLE 31

By means of the device as shown in FIG. 10, an image forming member for electrophotography having a first amorphous layer (I) of the layer constitution as shown in FIG. 9 was formed on an aluminum cylinder.

The conditions for preparation of the respective layer regions constituting the first amorphous layer (I) and the second amorphous layer (II) are shown in Table 9C below.

Distribution concentration of oxygen $C_{(O)1}$ ... 5 atomic %

Distribution concentration of oxygen $C_{(O)3}$ ... 2 atomic %

Distribution concentration of boron $C_{(III)3}$ ... 50 atomic ppm

Using the image forming member for electrophotography obtained, toner images were formed repeatedly on transfer papers by applying electrophotographic process similarly as in Example 23, whereby transferred toner images of high quality could be obtained stably.

EXAMPLE 32

By means of the device as shown in FIG. 10, an image forming member for electrophotography having a first amorphous layer (I) of the layer constitution as shown in FIG. 2 was formed on an aluminum cylinder.

The conditions for preparation of the respective layer regions constituting the first amorphous layer (I) and the second amorphous layer (II) are shown in Table 10C below.

Distribution concentration of oxygen $C_{(O)1}$ ... 3.5 atomic %

Distribution concentration of boron $C_{(III)1}$ ... 80 atomic ppm

Distribution concentration of boron $C_{(III)2}$ ... 500 atomic ppm

Using the image forming member for electrophotography obtained, toner images were formed repeatedly to transfer papers by applying electrophotographic process similarly as in Example 23, whereby transferred toner images of high quality could be obtained stably.

TABLE 9C

| Layer constitution | | Gases employed (Vol %) | Flow rate (SCCM) | Flow rate ratio | Layer formation speed (Å/S) | Layer thickness ($\mu$) |
|---|---|---|---|---|---|---|
| Amorphous layer (I) | First layer region ($t_2t_B$) | $SiH_4/He = 0.5$<br>NO 100<br>$B_2H_6/He = 3 \times 10^{-3}$ | $SiH_4 = 200$ | $NO/SiH_4 = 1.1 \times 10^{-2}$<br>$B_2H_6/SiH_4 = 4 \times 10^{-5}$ | 20 | 20 |
| | Second layer region ($t_1t_2$) | $SiH_4/He = 0.5$<br>NO 100<br>$B_2H_6/He = 3 \times 10^{-3}$ | $SiH_4 = 200$ | $NO/SiH_4 = 1.1 \times 10^{-2} \sim 4.4 \times 10^{-3}$<br>$B_2H_6/SiH_4 = 4 \times 10^{-5} \sim 0$ | 20 | 0.5 |
| | Third layer region ($t_5t_1$) | $SiH_4/He = 0.5$<br>NO 100<br>$B_2H_6/He = 3 \times 10^{-3}$ | $SiH_4 = 300$ | $NO/SiH_4 = 4.4 \times 10^{-3} \sim 0$ | 20 | 1 |
| Amorphous layer (II) | | $SiH_4/He = 0.5$<br>$SiF_4/He = 0.5$<br>$C_2H_4$ | $SiH_4 + SiF_4 = 150$ | $SiH_4:SiF_4:C_2H_4 = 4:2:4$ | 8 | 2 |

Al substrate temperature: 250° C.
Discharging frequency: 13.56 MHz
Discharging power: 0.2 W/cm$^2$
Inner pressure in reaction chamber: 0.5 Torr

TABLE 10C

| Layer constitution | | Gases employed (Vol %) | Flow rate (SCCM) | Flow rate ratio | Layer formation speed (Å/S) | Layer thickness ($\mu$) |
|---|---|---|---|---|---|---|
| Amorphous layer (I) | First layer region ($t_2t_B$) | $SiH_4/He = 0.5$<br>NO 100<br>$B_2H_6/He = 3.3 \times 10^{-3}$ | $SiH_4 = 200$ | $NO/SiH_4 = 4 \times 10^{-2}$<br>$B_2H_6/SiH_4 = 5 \times 10^{-4}$ | 20 | 0.3 |
| | Second layer region | $SiH_4/He = 0.5$<br>NO 100<br>$B_2H_6/He = 3.3 \times 10^{-3}$ | $SiH_4 = 200$ | $NO/SiH_4 = 4 \times 10^{-2}$<br>$B_2H_6/SiH_4 = 8 \times 10^{-5}$ | 20 | 20 |

TABLE 10C-continued

| Layer constitution | Gases employed (Vol %) | Flow rate (SCCM) | Flow rate ratio | Layer formation speed (Å/S) | Layer thickness ($\mu$) |
|---|---|---|---|---|---|
| ($t_1t_1$) Third layer region ($t_5t_1$) | $SiH_4/He = 0.5$<br>NO 100<br>$B_2H_6/He = 3.3 \times 10^{-3}$ | $SiH_4 = 200$ | $NO/SiH_4 = 4 \times 10^{-2} \sim 0$<br>$B_2H_6/SiH_4 = 8 \times 10^{-5} \sim 0$ | 20 | 1 |
| Amorphous layer (II) | $SiH_4/He = 0.5$<br>$SiF_4/He = 0.5$<br>$C_2H_4$ | $SiH_4 = 100$ | $SiH_4:SiF_4:C_2H_4 = 3:3:4$ | 7 | 2 |

Al substrate temperature: 250° C.
Discharging frequency: 13.56 MHz
Discharging power: 0.2 W/cm²
Inner pressure in reaction chamber: 0.5 Torr

EXAMPLE 33

By means of the device as shown in FIG. 10, an image forming member for electrophotography having a first amorphous layer (I) of the layer constitution as shown in FIG. 3 was formed on an aluminum cylinder.

The conditions for preparation of the respective layer regions constituting the first amorphous layer (I) and the second amorphous layer (II) are shown in Table 11C below.

Distribution concentration of oxygen $C_{(O)1}$ . . . 3.5 atomic %

Distribution concentration of boron $C_{(III)1}$ . . . 80 atomic ppm

Using the image forming member for electrophotography obtained, toner images were formed repeatedly on transfer papers by applying electrophotographic process similarly as in Example 23, whereby transferred toner images of high quality could be obtained stably.

second amorphous layer comprising an amorphous material represented by any of the following formulae:

$$Si_aC_{1-a} (0.4 < a < 1) \tag{1}$$

$$(Si_bC_{1-b})_cH_{1-c} (0.5 < b < 1, 0.6 \leq c < 1) \tag{2}$$

$$(Si_dC_{1-d})_eX_{1-e} (0.47 < d < 1, 0.8 \leq e < 1) \tag{3}$$

$$(Si_fC_{1-f})_g(H+X)_{1-g} (0.47 < f < 1, 0.8 \leq g < 1) \tag{4}$$

wherein X represents a halogen atom.

2. A photoconductive member according to claim 1, wherein the first layer region and the second layer region share at least a portion thereof.

3. A photoconductive member according to claim 1, wherein the first layer region and the second layer region are substantially the same region.

4. A photoconductive member according to claim 1, wherein the second layer region exists internally within the first layer region.

TABLE 11C

| Layer constitution | | Gases employed (Vol %) | Flow rate (SCCM) | Flow rate ratio | Layer formation speed (Å/S) | Layer thickness ($\mu$) |
|---|---|---|---|---|---|---|
| Amorphous layer (I) | First layer region ($t_2t_B$) | $SiH_4/He = 0.5$<br>$SiF_4/He = 0.5$<br>NO 100<br>$B_2H_6/He = 3 \times 10^{-3}$ | $SiH_4 = 200$ | $NO/(SiH_4 + SiF_4) = 4 \times 10^{-2}$<br>$SiF_4/SiH_4 = 0.2$<br>$B_2H_6/(SiH_4 + SiF_4) = 8 \times 10^{-5}$ | 20 | 20 |
| | Second layer region ($t_1t_2$) | $SiH_4/He = 0.5$<br>$SiF_4/He = 0.5$<br>NO 100<br>$B_2H_6/He = 3 \times 10^{-3}$ | $SiH_4 = 200$ | $NO/(SiH_4 + SiF_4) = 4 \times 10^{-2} \sim 2 \times 10^{-2}$<br>$SiF_4/SiH_4 = 0.2$<br>$B_2H_6/(SiH_4 + SiF_4) = 8 \times 10^{-5}$ | 20 | 0.5 |
| | Third layer region ($t_5t_1$) | $SiH_4/He = 0.5$<br>$SiF_4/He = 0.5$<br>NO 100<br>$B_2H_6/He = 3 \times 10^{-3}$ | $SiH_4 = 200$ | $NO/SiH_4 + SiF_4) = 2 \times 10^{-2} \sim 0$<br>$SiF_4/SiH_4 = 0.2$<br>$B_2H_6/(SiH_4 + SiF_4) = 8 \times 10^{-5} \sim 0$ | 20 | 0.5 |
| Amorphous layer (II) | | $SiH_4/He = 0.5$<br>$SiF_4/He = 0.5$<br>$C_2H_4$ | $SiH_4 + SiF_4 = 150$ | $SiH_4:SiF_4:C_2H_4 = 3:2:5$ | 8 | 2 |

Al substrate temperature: 250° C.
Discharging frequency: 13.56 MHz
Discharging power: 0.18 W/cm²
Inner pressure in reaction chamber: 0.5 Torr

We claim:

1. A photoconductive member which comprises a support for a photoconductive member, a first amorphous layer exhibiting photoconductivity comprising an amorphous material containing silicon atoms as a matrix, said first amorphous layer having a first layer region containing oxygen atoms in a distribution which is continuous and nonuniform in the direction of layer thickness and a second layer region containing atoms belonging to the group III of the periodic table as constituent atoms in a distribution which is continuous and nonuniform in the direction of layer thickness, and a 5. A photoconductive member according to claim 1, wherein the first layer region constitutes substantially the whole layer region of the amorphous layer.

6. A photoconductive member according to claim 1, wherein the second layer region constitutes substantially the whole layer region of the amorphous layer.

7. A photoconductive member according to claim 1, wherein oxygen atoms are contained in the first layer region in a decreasing depth profile toward the side opposite to the side at which the support is provided.

8. A photoconductive member according to claim 1, wherein oxygen atoms are contained in the first layer region in a depth profile having a high concentration distribution on the support side.

9. A photoconductive member according to claim 1, wherein the content of the atoms belonging to the group III of the periodic table in the second layer region is 0.01 to $5 \times 10^4$ atomic ppm.

10. A photoconductive member according to claim 1, wherein the content of oxygen atoms in the first layer region is 0.001 to 30 atomic %.

11. A photoconductive member according to claim 8, wherein the high concentration distribution is formed in a layer region within 10 Å to 10μ from the support side.

12. A photoconductive member according to claim 1, wherein the depth profile of the atoms belonging to the group III of the periodic table is such that a high concentration distribution is formed on the support side.

13. A photoconductive member according to claim 12, wherein the higher concentration distribution is formed in a layer region within 10 Å to 10μ from the support side.

14. A photoconductive member according to claim 1, wherein hydrogen atoms are contained in the first amorphous layer.

15. A photoconductive member according to claim 14, wherein the content of hydrogen atoms in the first amorphous layer is 1 to 40 atomic %.

16. A photoconductive member according to claim 1, wherein halogen atoms are contained in the first amorphous layer.

17. A photoconductive member according to claim 16, wherein the content of halogen atoms is 1 to 40 atomic %.

18. A photoconductive member according to claim 1, wherein both of hydrogen atoms and halogen atoms are contained in the first amorphous layer.

19. A photoconductive member according to claim 18, wherein the total content of hydrogen atoms and halogen atoms is 1 to 40 atomic %.

20. A photoconductive member according to claim 1, wherein the first amorphous layer has a layer thickness of 1 to 100μ.

21. A photoconductive member according to claim 1, wherein the second amorphous layer has a layer thickness of 0.003 to 30μ.

* * * * *